(12) United States Patent
Kuo et al.

(10) Patent No.: US 8,513,772 B2
(45) Date of Patent: Aug. 20, 2013

(54) METHOD FOR FABRICATING A THREE-DIMENSIONAL INDUCTOR CARRIER WITH METAL CORE AND STRUCTURE THEREOF

(71) Applicant: Chipbond Technology Corporation, Hsinchu (TW)

(72) Inventors: Chih-Ming Kuo, Hsinchu County (TW); You-Ming Hsu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/739,210

(22) Filed: Jan. 11, 2013

(65) Prior Publication Data

US 2013/0127578 A1 May 23, 2013

Related U.S. Application Data

(62) Division of application No. 13/247,076, filed on Sep. 28, 2011, now Pat. No. 8,432,017.

(51) Int. Cl.
*H01L 27/08* (2006.01)
(52) U.S. Cl.
USPC .................... 257/531; 257/532; 257/E21.022

(58) Field of Classification Search
USPC ............ 257/531, 532, 686, E21.022, E23.01; 438/381; 336/200
See application file for complete search history.

(56) References Cited

U.S. PATENT DOCUMENTS

| | | | | |
|---|---|---|---|---|
| 6,037,649 A * | 3/2000 | Liou | ........................... | 257/531 |
| 7,339,452 B2 * | 3/2008 | Lee | ............................... | 336/200 |
| 7,397,107 B2 * | 7/2008 | Brennan et al. | ............... | 257/532 |
| 8,347,490 B1 * | 1/2013 | Kuo et al. | ....................... | 29/605 |

* cited by examiner

*Primary Examiner* — Chuong A Luu
*Assistant Examiner* — Nga Doan
(74) *Attorney, Agent, or Firm* — Jackson IPG PLLC

(57) ABSTRACT

A method for fabricating a inductor carrier comprises the steps of providing a substrate with a protective layer; forming a first photoresist layer on protective layer; patterning the first photoresist layer to form a first opening and first apertures; forming a first metal layer within first opening and first apertures; removing the first photoresist layer; forming a first dielectric layer on protective layer; forming a second photoresist layer on first dielectric layer; patterning the second photoresist layer to form a second aperture and a plurality of third apertures; forming a second metal layer within second aperture and third apertures; removing the second photoresist layer; forming a second dielectric layer on first dielectric layer; forming a third photoresist layer on second dielectric layer; patterning the third photoresist layer to form a fifth aperture and sixth apertures; forming a third metal layer within fifth aperture and sixth apertures.

12 Claims, 24 Drawing Sheets

METHOD FOR FABRICATING A THREE-DIMENSIONAL INDUCTOR CARRIER WITH METAL CORE AND STRUCTURE THEREOF

FIELD OF THE INVENTION

The present invention is generally relating to a manufacturing method for a carrier, more particularly to the method for fabricating a three-dimensional inductor carrier with metal core.

BACKGROUND OF THE INVENTION

A conventional inductor is best-known as planar inductor, and mentioned planar inductor may be utilized for designs of inductor pattern and trace pattern in a same plane. Owing to the reason that the planar inductor and the trace pattern are located in the same plane, a disturbance from parasitic capacitance is occurred and has to be overcome. Therefore, the chip size corresponded to the design pattern can not be decreased. Besides, the planar inductor merely forms a vortex structure instead of a toroid structure in a same radius.

SUMMARY

The primary object of the present invention is to provide a method for fabricating a three-dimensional inductor carrier with metal core comprising the steps of: providing a substrate having a surface, at least one first bond pad and a protective layer, wherein the first bond pad is disposed on the surface, the protective layer is formed on the surface, and the protective layer comprises at least one first pad opening, a first disposing area, and a plurality of second disposing areas, wherein the first pad opening reveals the first bond pad and is located at the first disposing area; forming a first photoresist layer on the protective layer; patterning the first photoresist layer to form at least one first opening and a plurality of first apertures, wherein the first opening reveals the first disposing area, and the first apertures reveal the second disposing areas; forming a first metal layer within the first opening and the first apertures and enabling the first metal layer to have a first conductive pad and a plurality of first inductor portions, and each of the first inductor portions comprises a first connection terminal, a second connection terminal and a first height; removing the first photoresist layer; forming a first dielectric layer on the protective layer and covering the first metal layer with the first dielectric layer, wherein the first dielectric layer comprises a second pad opening, a plurality of first connection openings and a plurality of second connection openings, wherein the second pad opening reveals the first conductive pad, each of the first connection openings reveals each of the first connection terminals, and each of the second connection openings reveals each of the second connection terminals; forming a second photoresist layer on the first dielectric layer; patterning the second photoresist layer to form a second aperture, a plurality of third apertures, a plurality of fourth apertures and a slot, wherein the second aperture reveals the first conductive pad, each of the third apertures reveals each of the first connection terminals, each of the fourth apertures reveals each of the second connection terminals, the slot reveals the first dielectric layer and is located between each of the third apertures and each of the fourth apertures, wherein the second aperture comprises a first top, a first depth is formed between the first top and the first conductive pad, each of the third apertures comprises a second top, a second depth is formed between each of the second tops and each of the first connection terminals, each of the fourth apertures comprises a third top, a third depth is formed between each of the third tops and each of the second connection terminals, the slot comprises a fourth top, a fourth depth is formed between the fourth top and the first dielectric layer, and the fourth depth is respectively smaller than the first, second and the third depth; forming a second metal layer within the second aperture, the third apertures, the fourth apertures and the slot and enabling the second metal layer to have a second inductor portion, a plurality of third inductor portions, a plurality of fourth inductor portions and a metal core, wherein the second inductor portion is coupled with the first conductive pad and comprises a first top surface and a second height, each of the third inductor portions is coupled with each of the second connection terminals and comprises a second top surface and a third height, each of the fourth inductor portions is coupled with each of the first connection terminals and comprises a third top surface and a fourth height, wherein the first height is respectively smaller than the second, third and fourth height, the metal core comprises a bottom surface, the first metal layer comprises a first upper surface, and a first interval is formed between the bottom surface and the first upper surface; removing the second photoresist layer; forming a second dielectric layer on the first dielectric layer and covering the second metal layer with the second dielectric layer, wherein the second dielectric layer comprises a first exposed hole, a plurality of second exposed holes and a plurality of third exposed holes, the first exposed hole reveals the first top surface, each of the second exposed holes reveals each of the second top surfaces, and each of the third exposed holes reveals each of the third top surfaces; forming a third photoresist layer on the second dielectric layer; patterning the third photoresist layer to form a fifth aperture and a plurality of sixth apertures, wherein the fifth aperture reveals the first top surface and the second top surface, and each of the sixth apertures reveals each of the second top surfaces and each of the third top surfaces; forming a third metal layer within the fifth aperture and the sixth apertures and enabling the third metal layer to have a fifth inductor portion and a plurality of sixth inductor portions, wherein the fifth inductor portion is coupled with the second inductor portion and the third inductor portion, each of the sixth inductor portions is coupled with the third inductor portion and the fourth inductor portion, the fifth inductor portion comprises a fifth height, each of the sixth inductor portions comprises a sixth height, the fifth height is respectively smaller than the second, third and fourth height, and the sixth height is respectively smaller than the second, third and fourth height. In this invention, the inductor carrier possesses the structure of three-dimensional inductor and additional metal core thereby reducing the chip size and the layout area in a same plane. Besides, mentioned structure may increase coil density and magnetic flux. Furthermore, the magnetic flux direction of the inductor changes from normal to horizontal for three-dimensional designs of the inductor, and it is beneficial for electro-magnetic coupling of flip chip module in the flip chip process.

DETAILED DESCRIPTION OF THE INVENTION

Figure 1A:
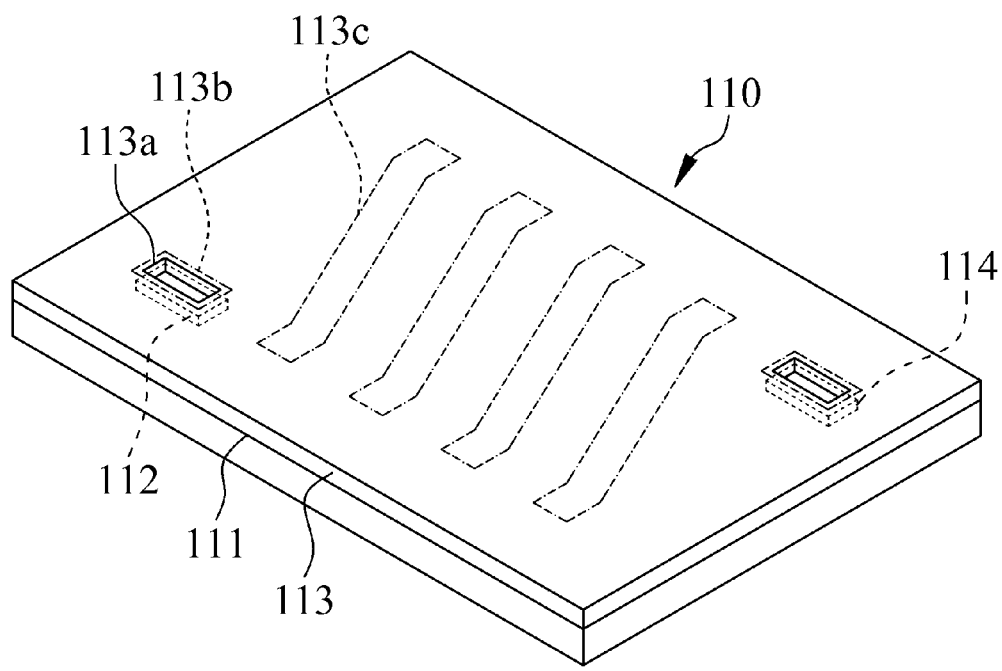
FIGS. 1A to 1P are three-dimensional diagrams illustrating a method for fabricating a three-dimensional inductor carrier with metal core in accordance with a first preferred embodiment of the present invention.
Figure 1B:
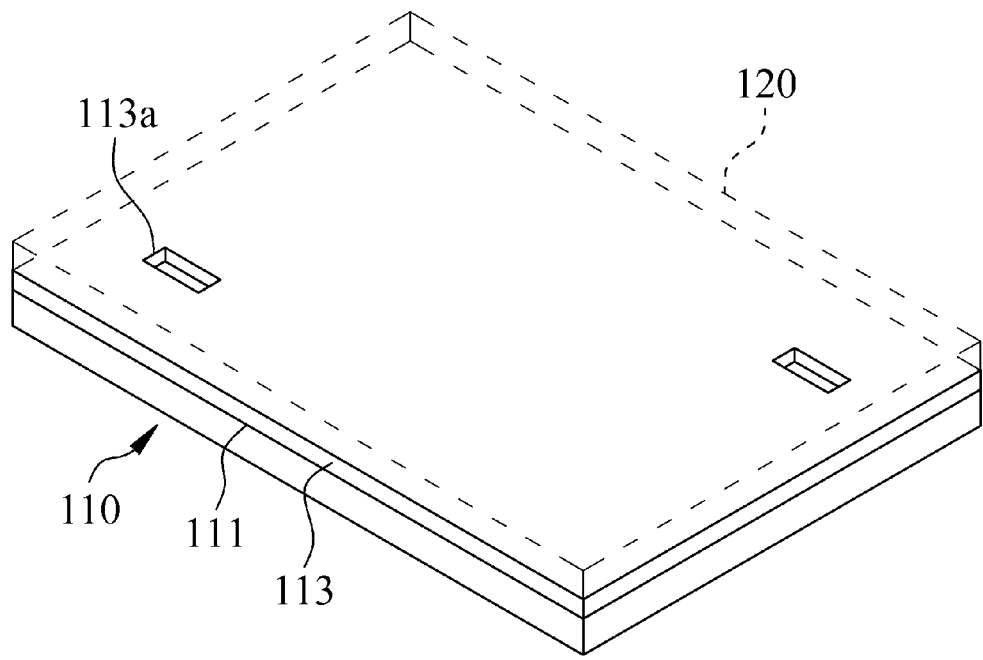
Figure 1C:
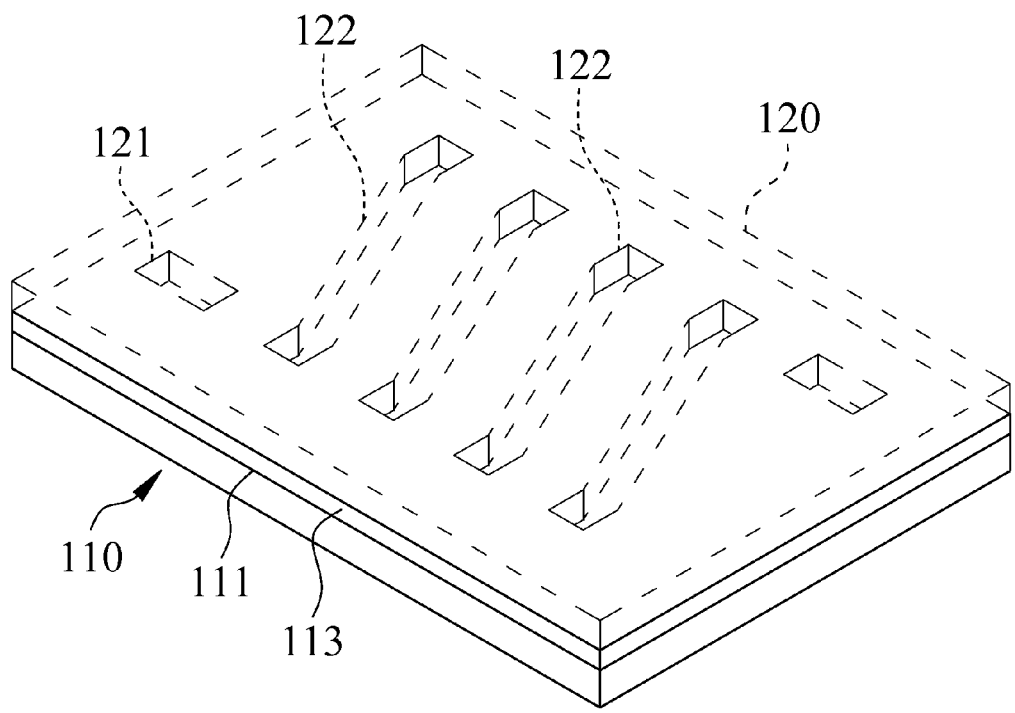
Figure 1D:
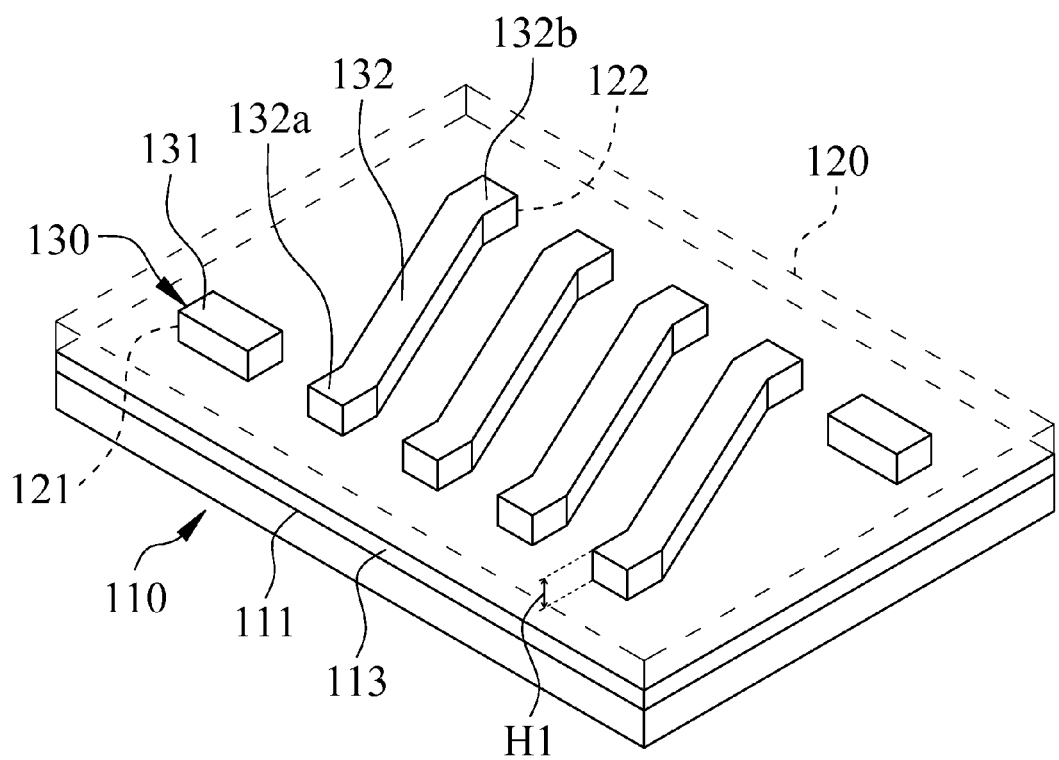
Figure 1E:
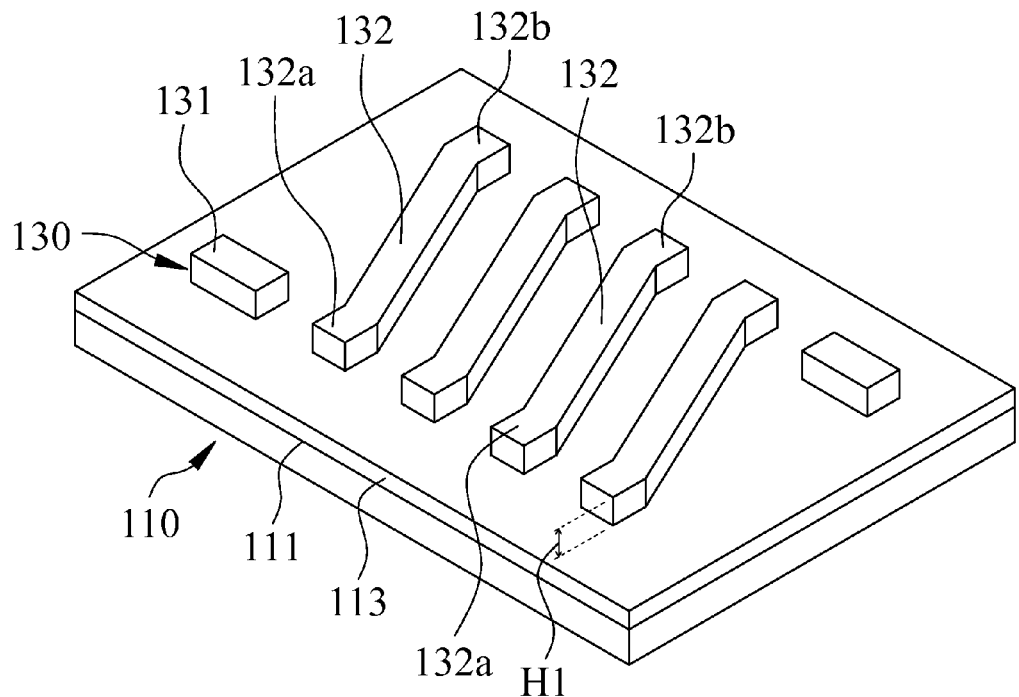
Figure 1F:
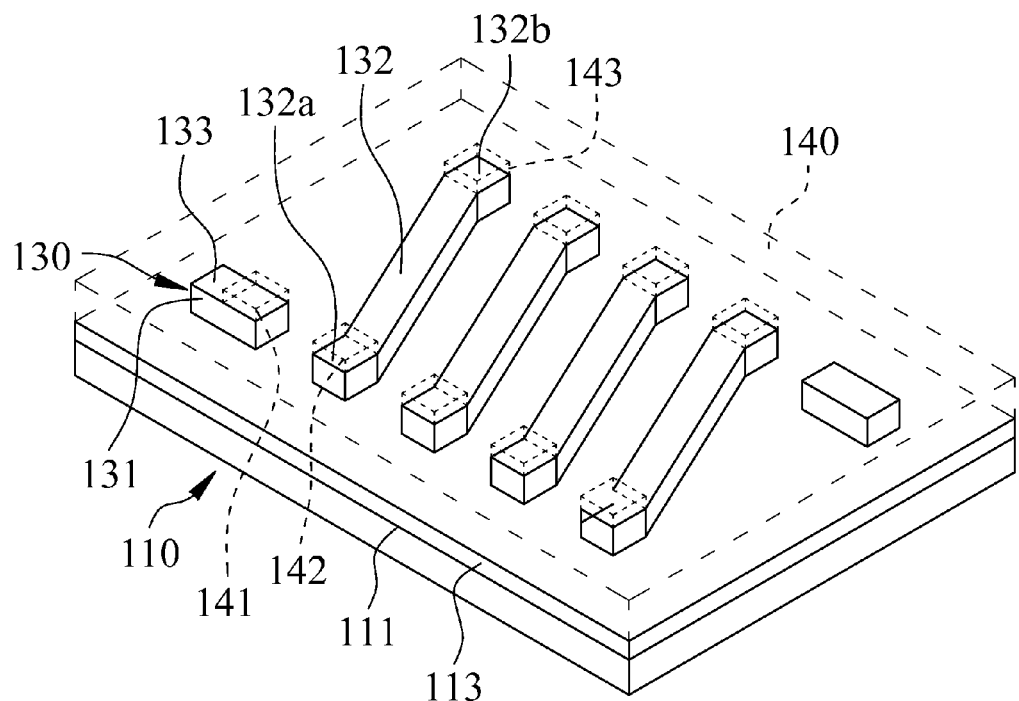
Figure 1G:
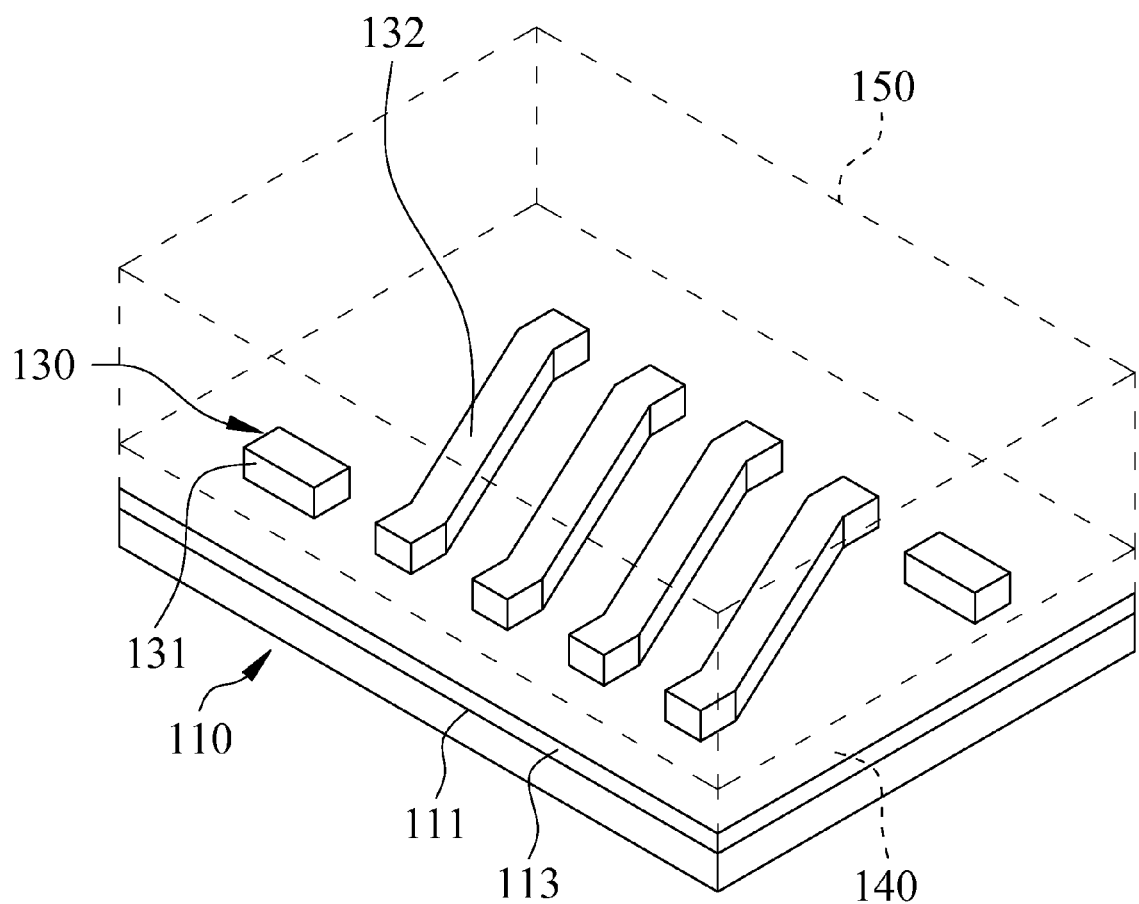
Figure 1H:
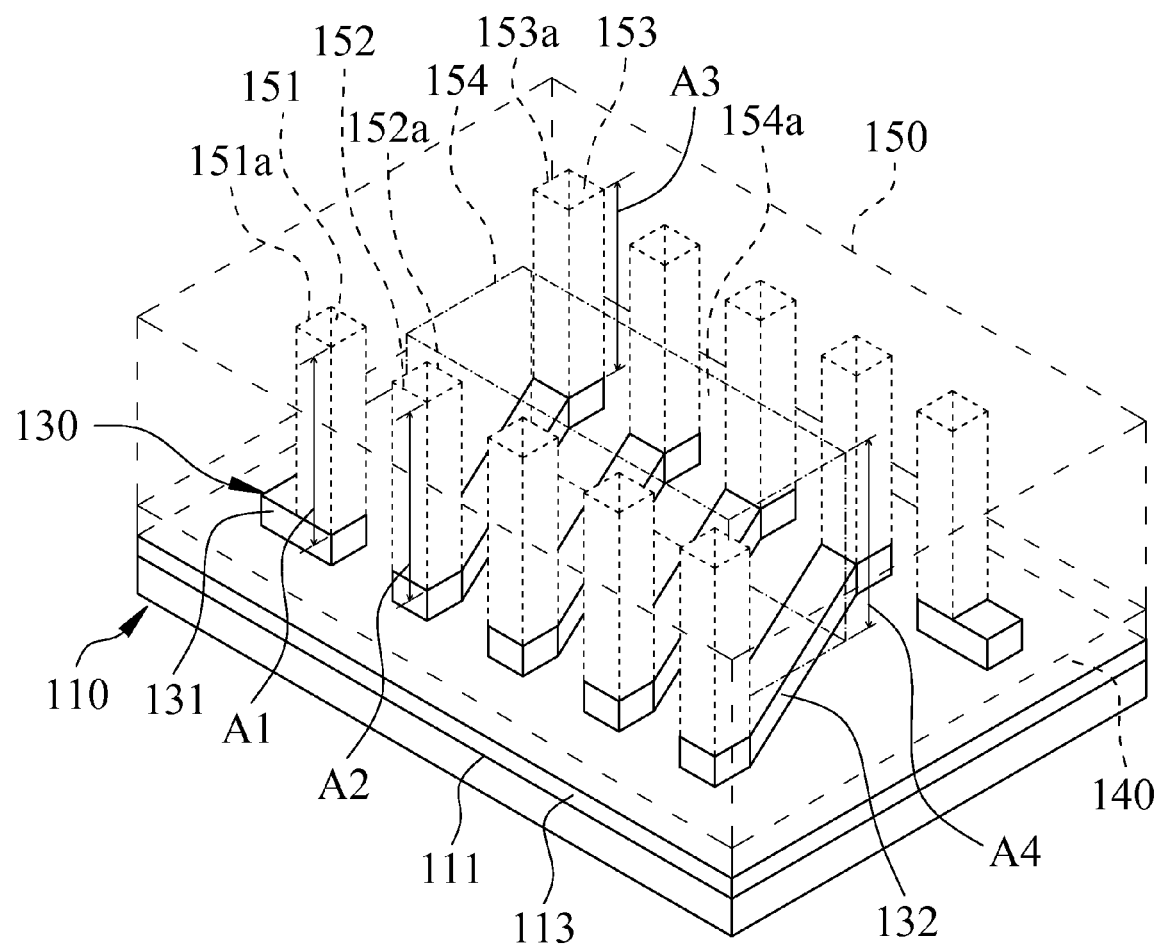
Figure 1I:
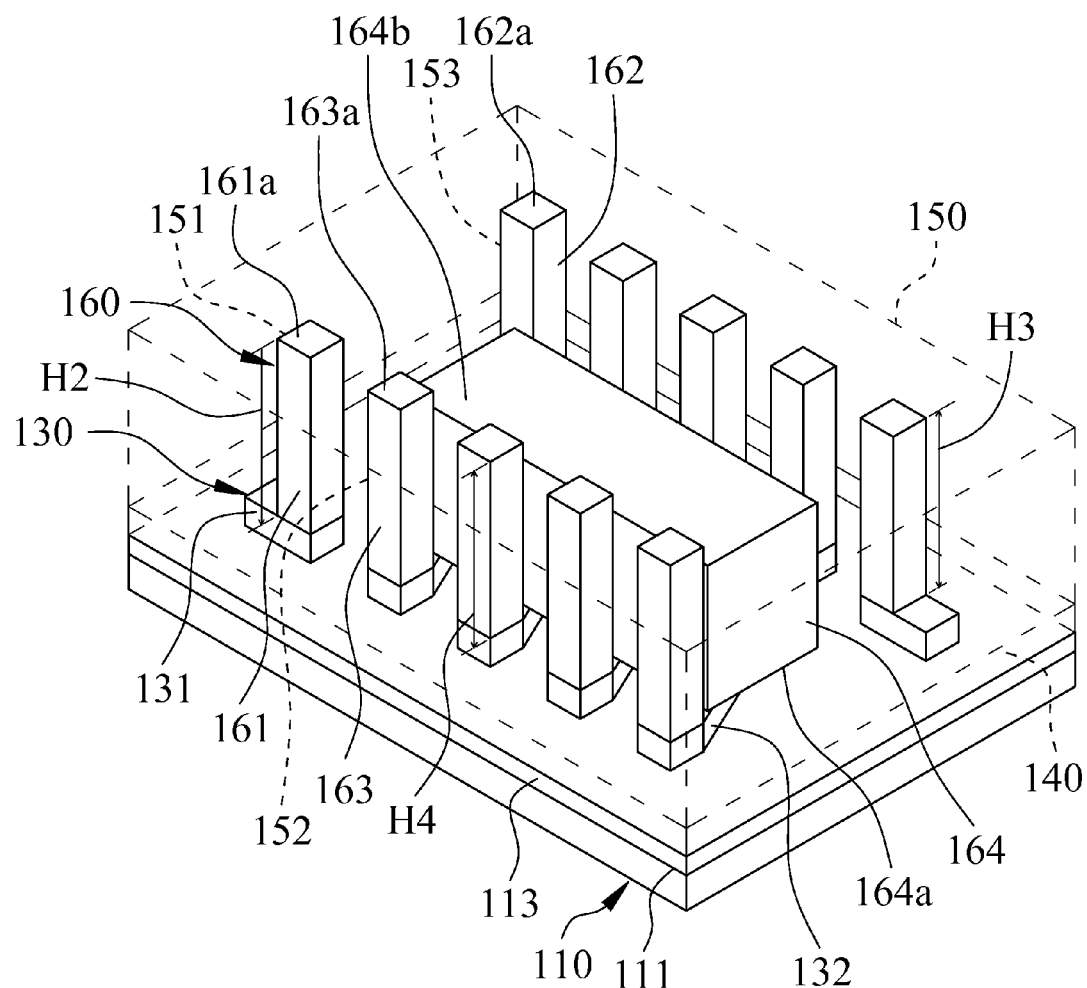
Figure 1J:
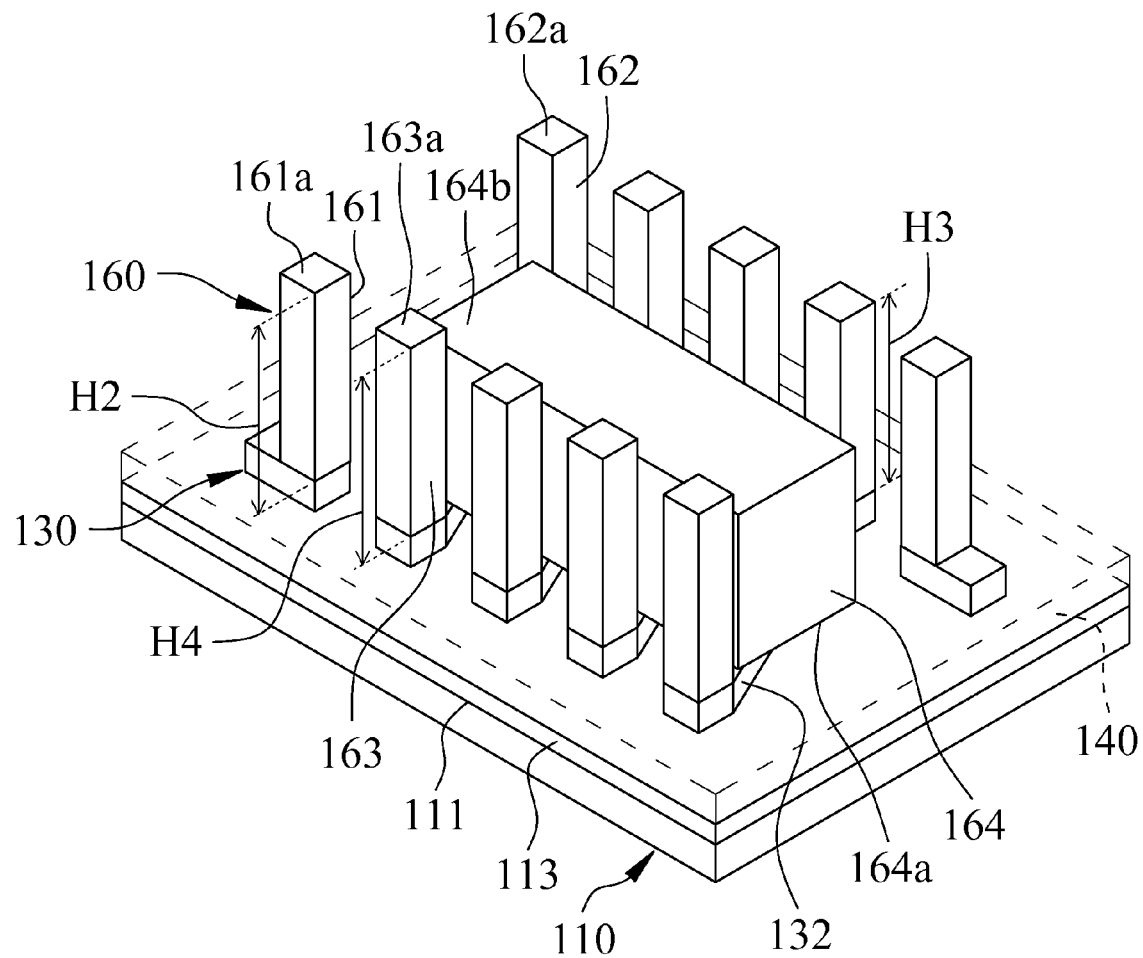
Figure 1K:
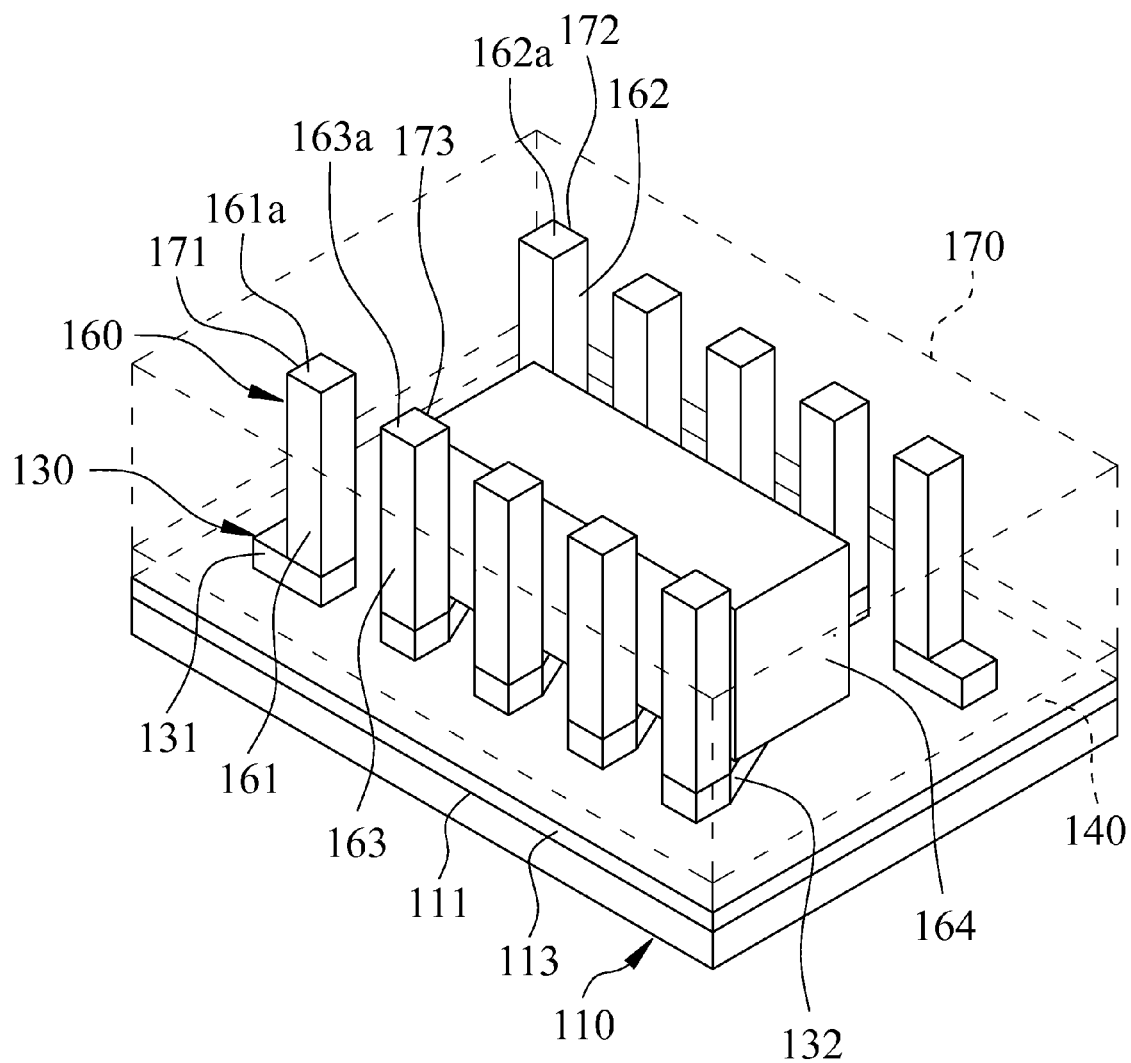
Figure 1L:
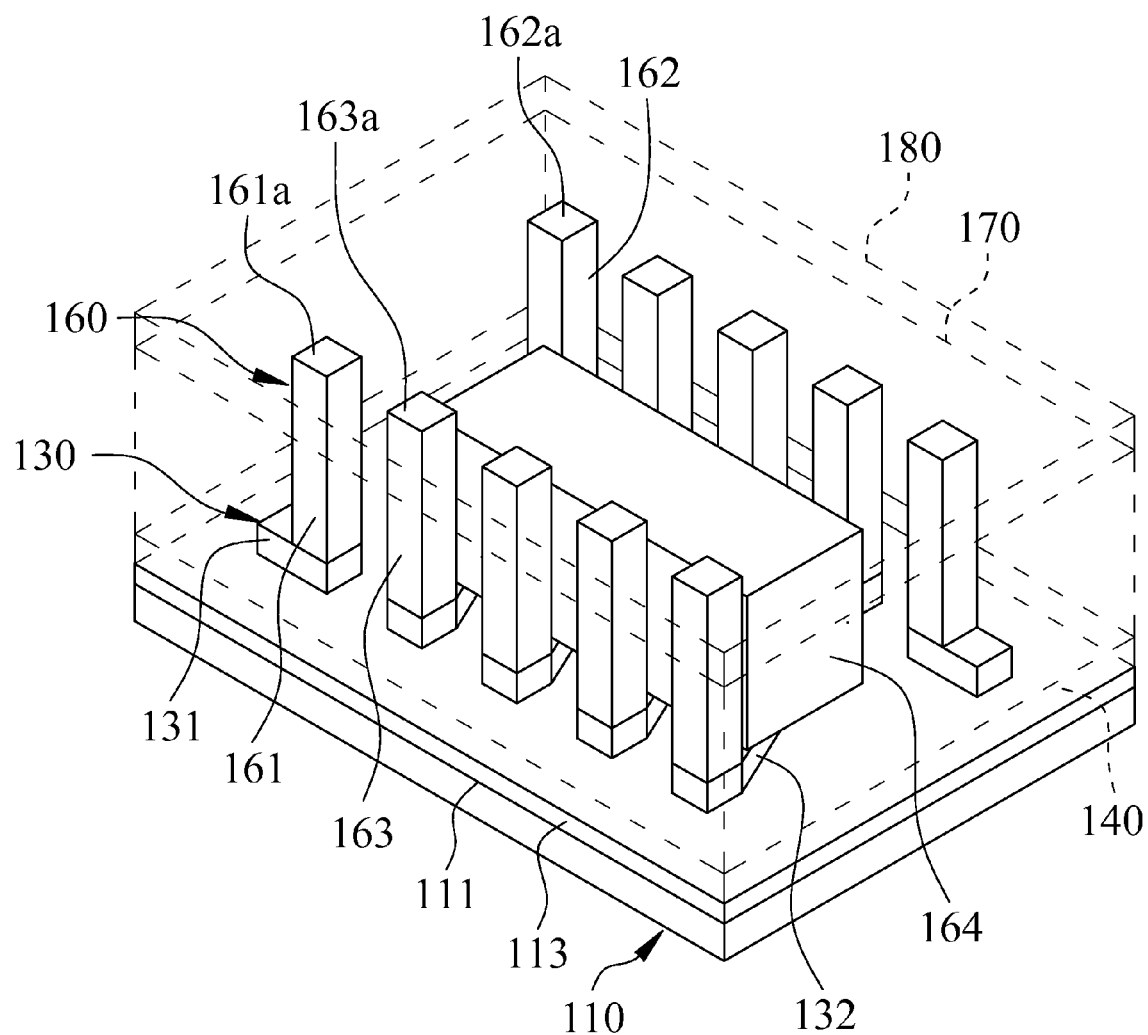
Figure 1M:
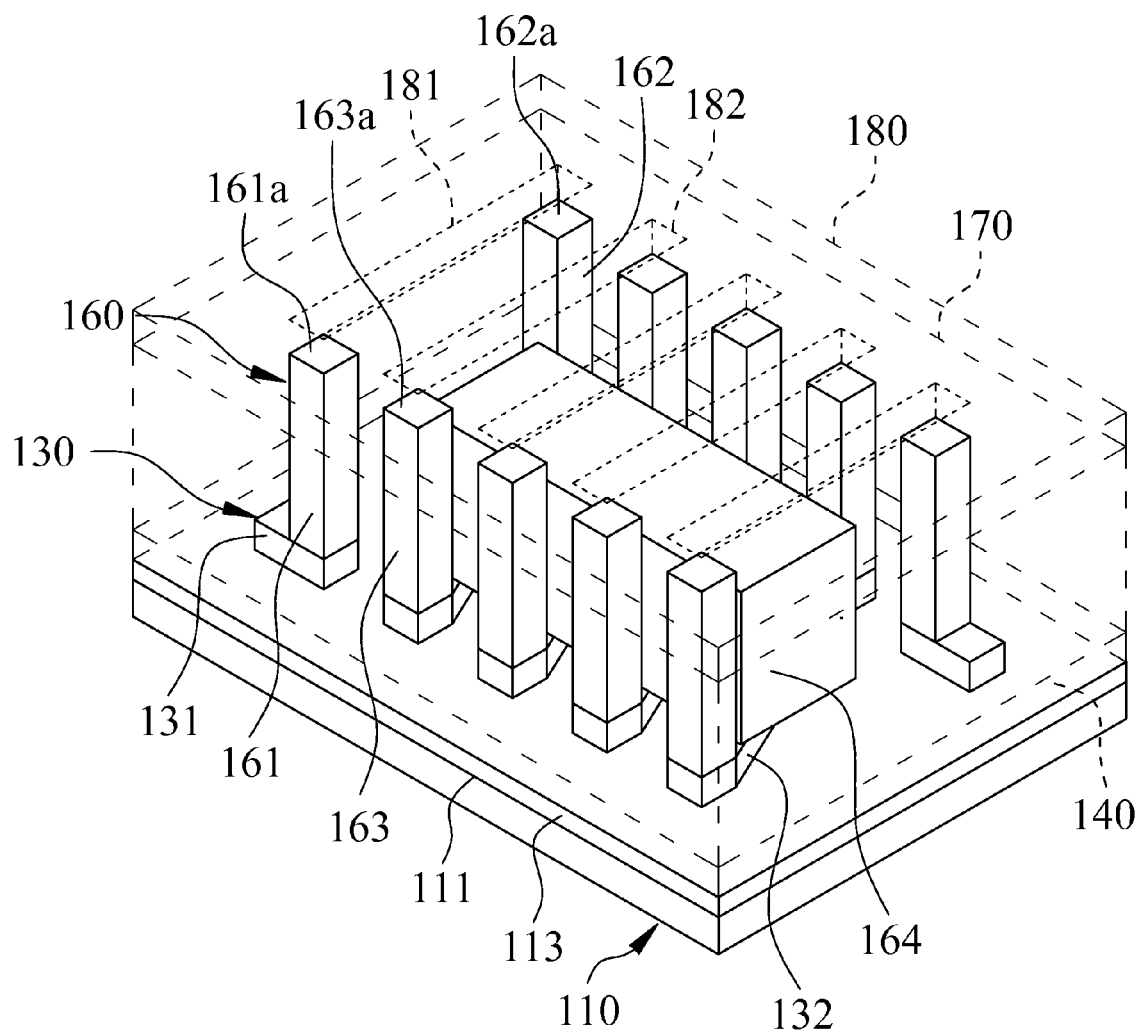
Figure 1N:
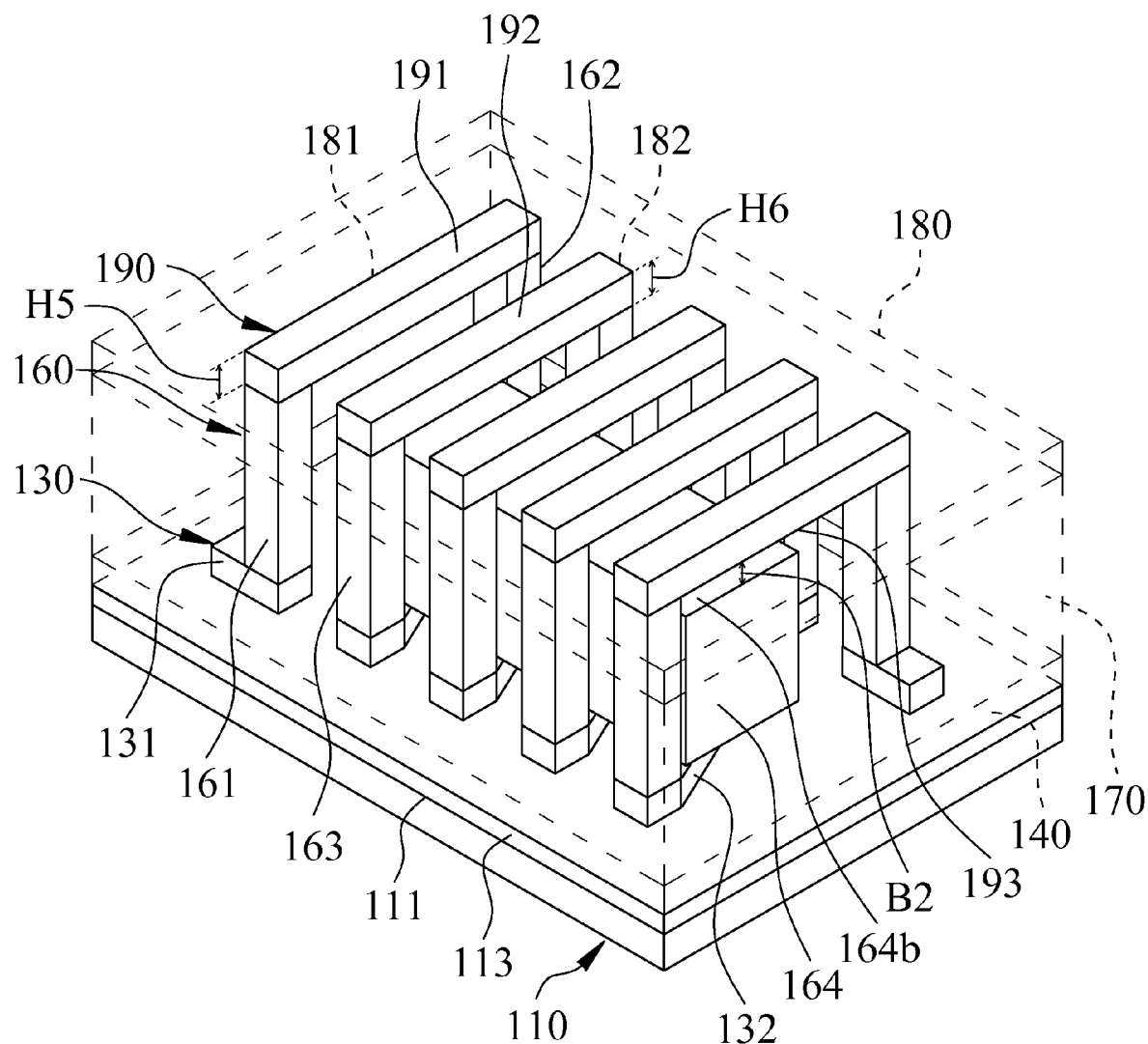
Figure 1O:
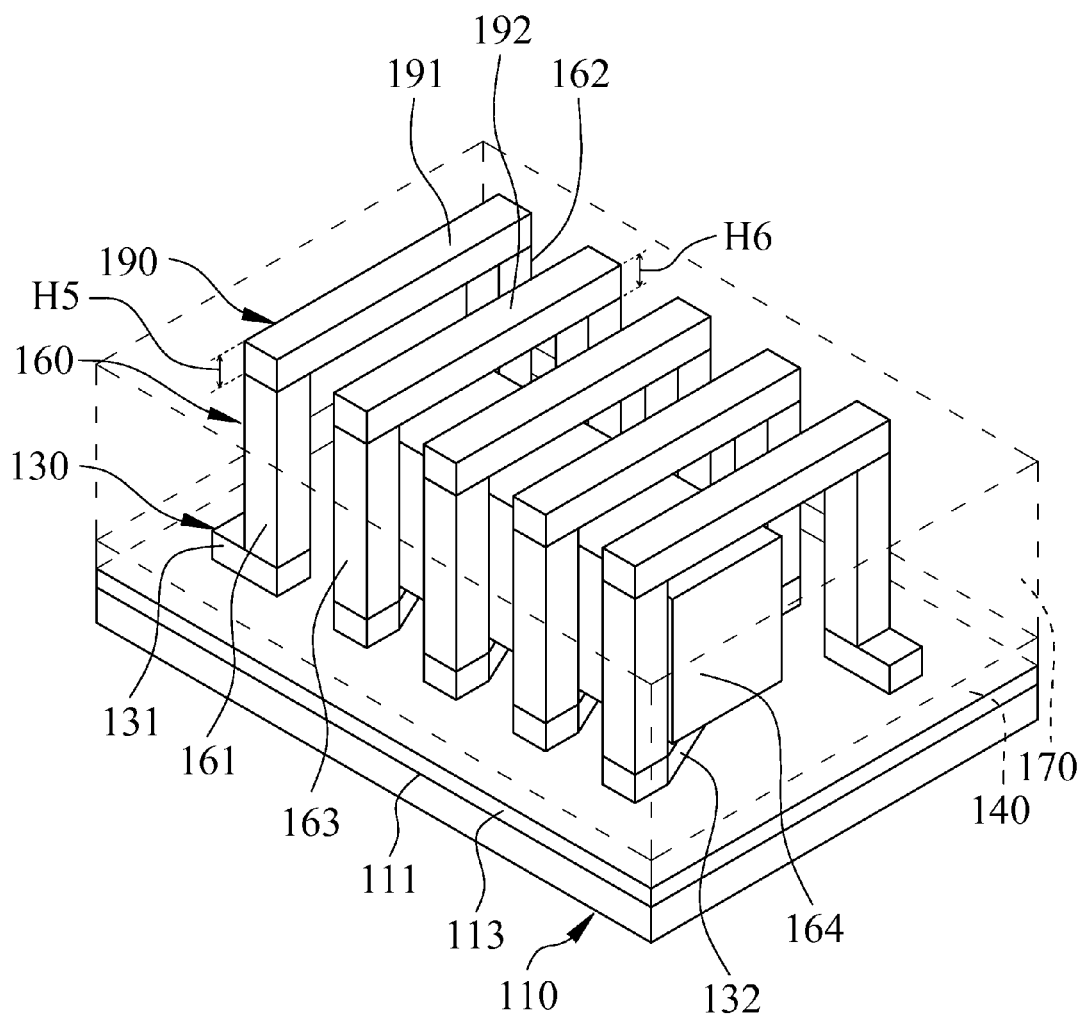
Figure 1P:
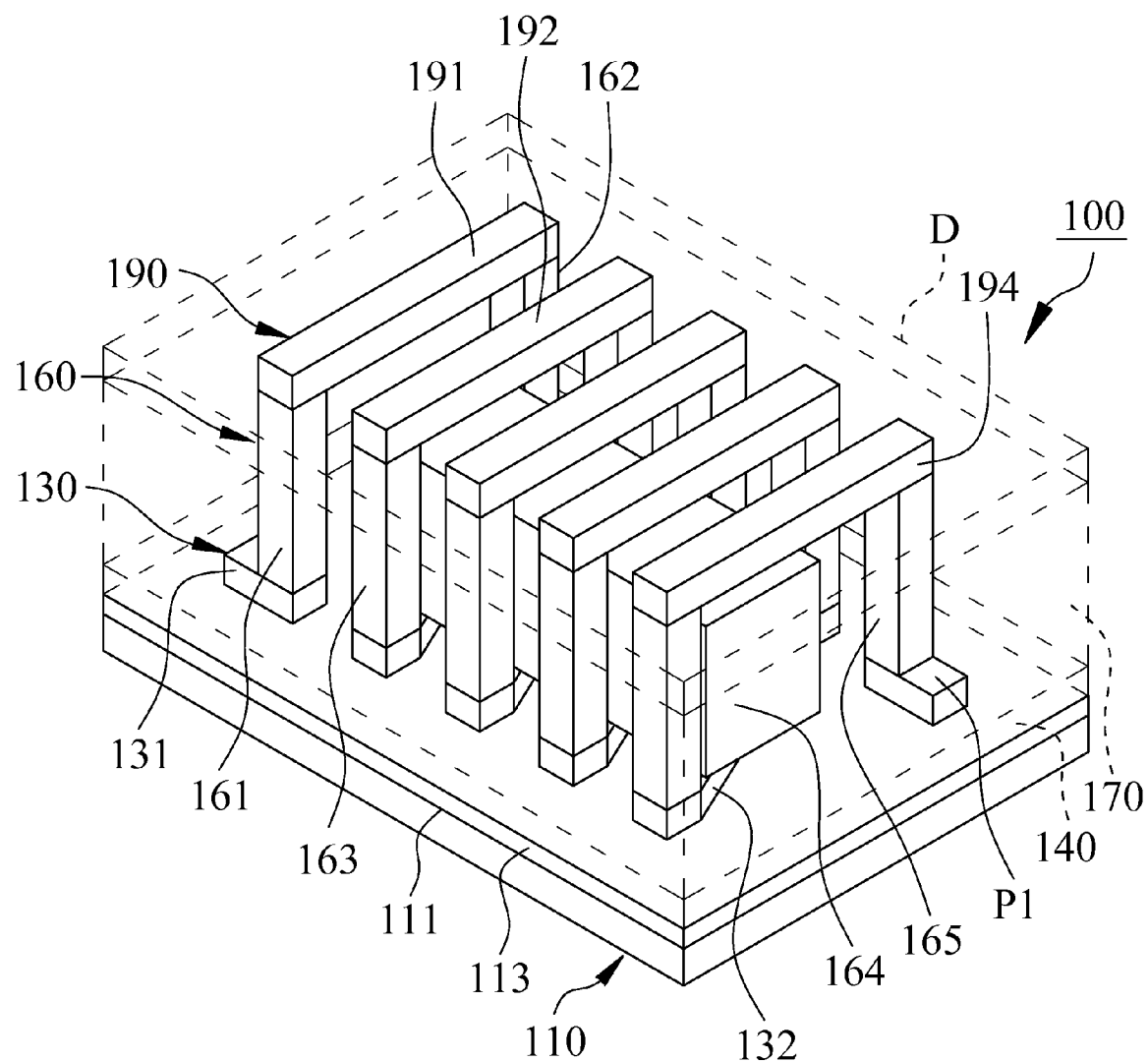
Figure 2A:
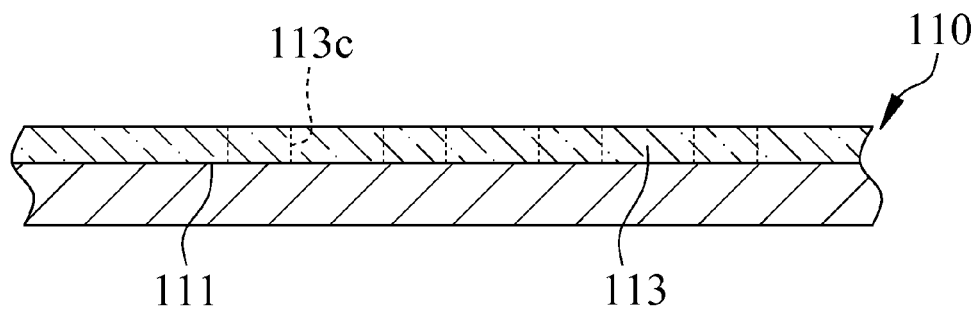
FIGS. 2A to 2P are cross-section diagrams illustrating a method for fabricating a three-dimensional inductor carrier with metal core in accordance with a first preferred embodiment of the present invention.
Figure 2B:
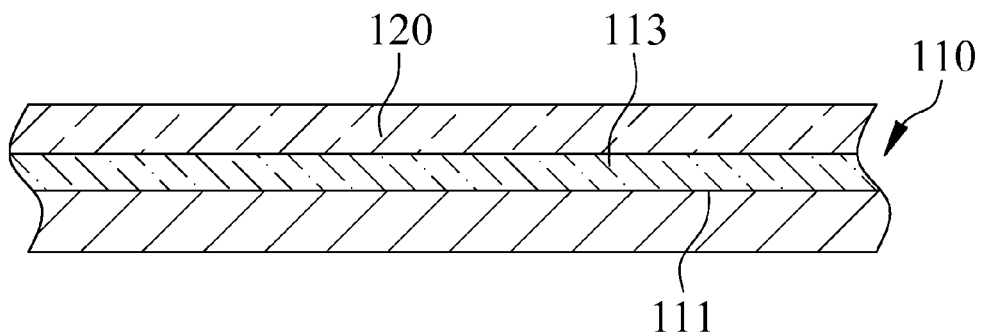
Figure 2C:
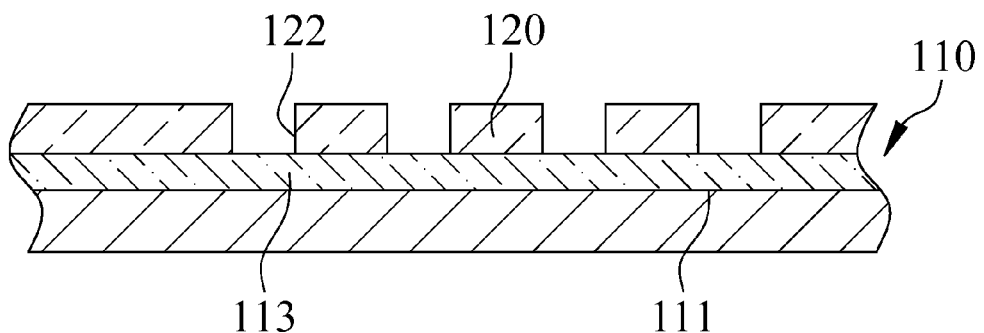
Figure 2D:
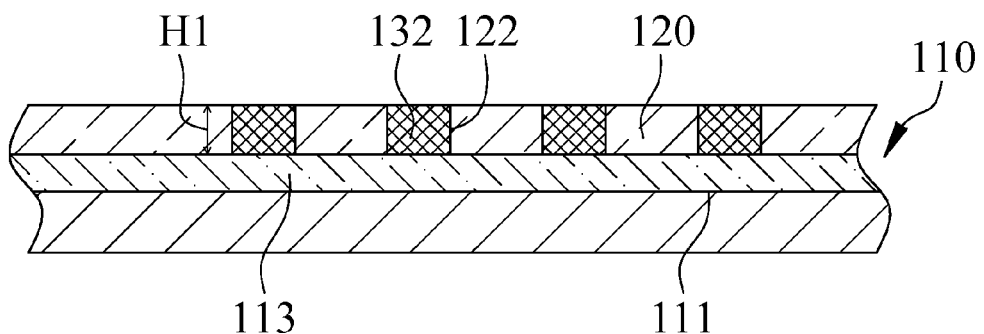
Figure 2E:
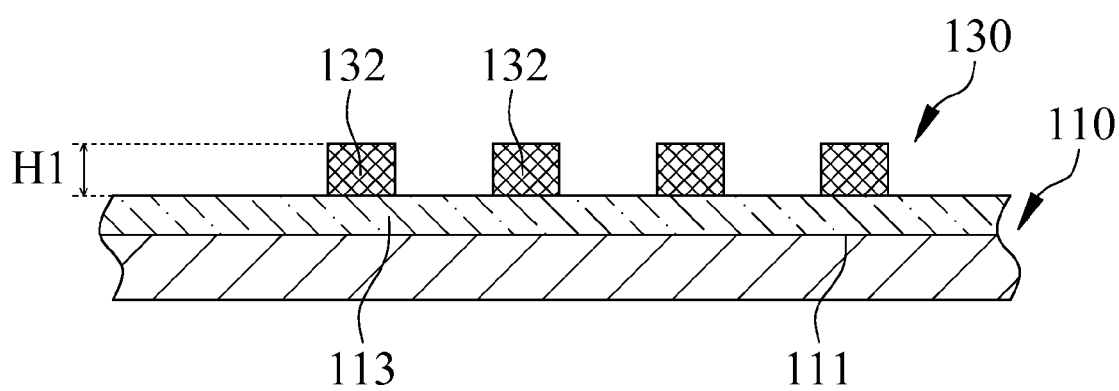
Figure 2F:
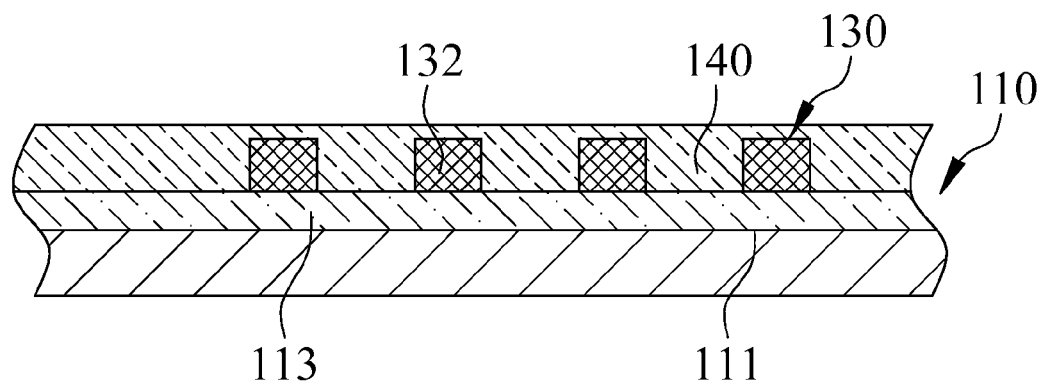
Figure 2G:
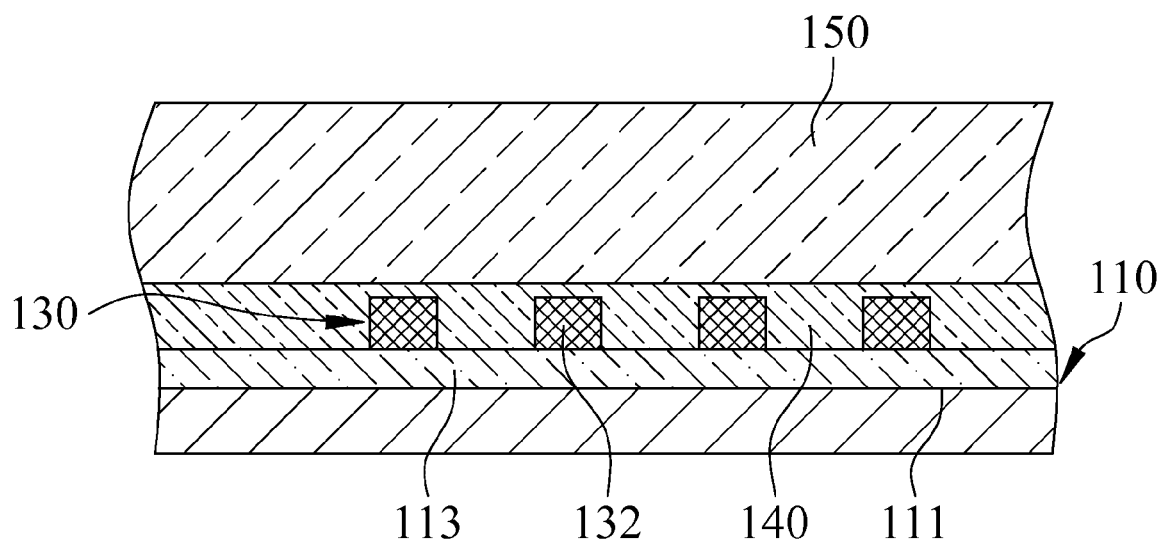
Figure 2H:
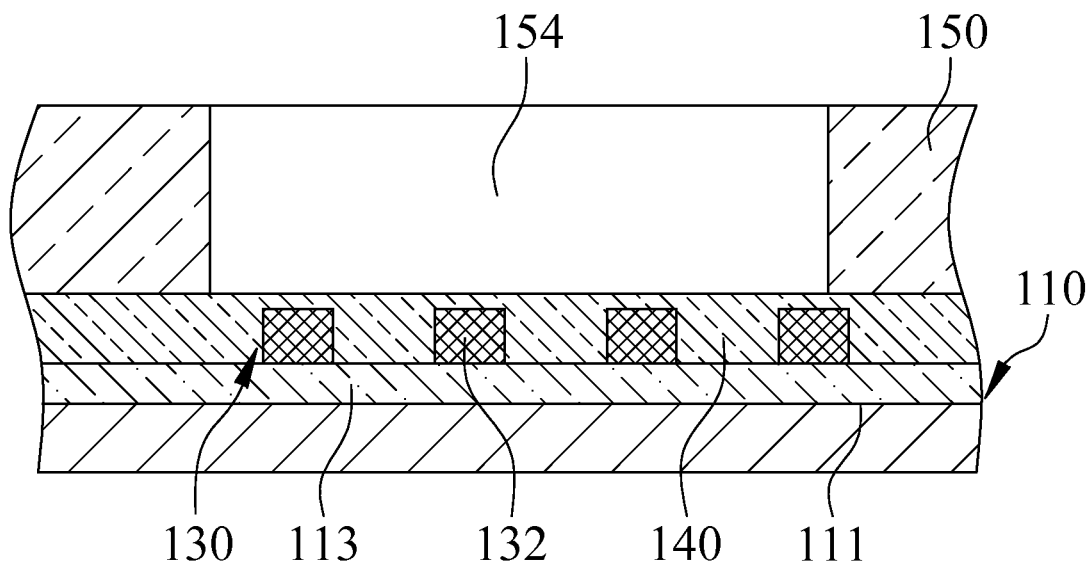
Figure 2I:
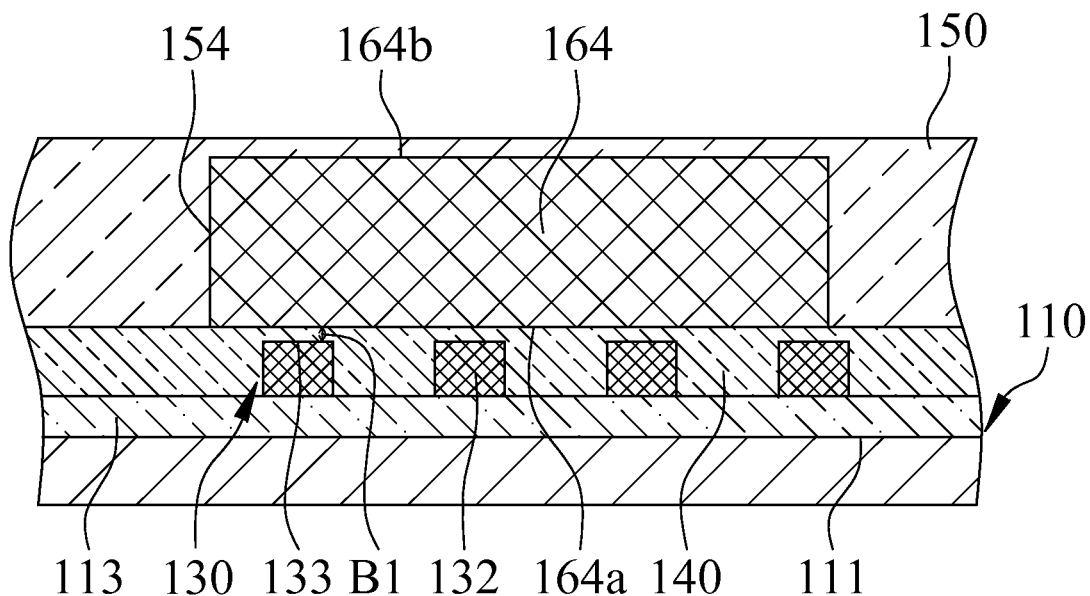
Figure 2J:
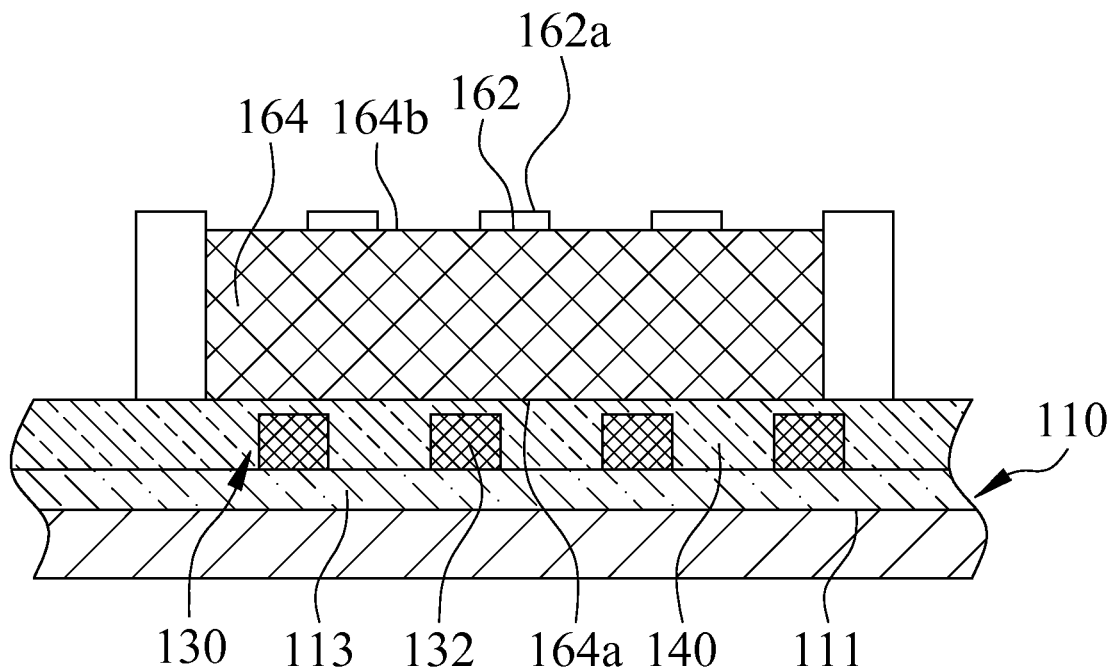
Figure 2K:
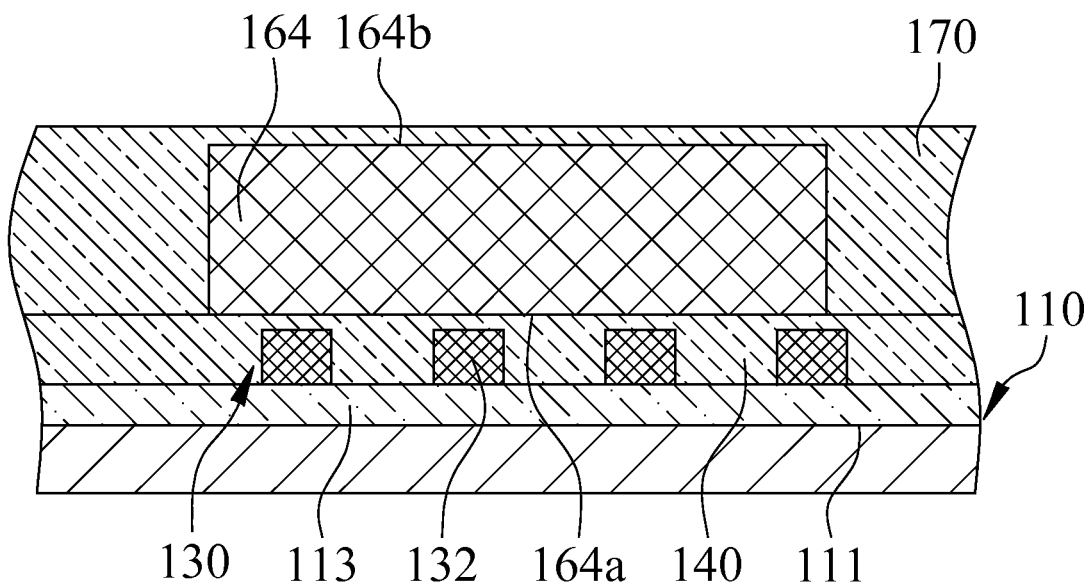
Figure 2L:
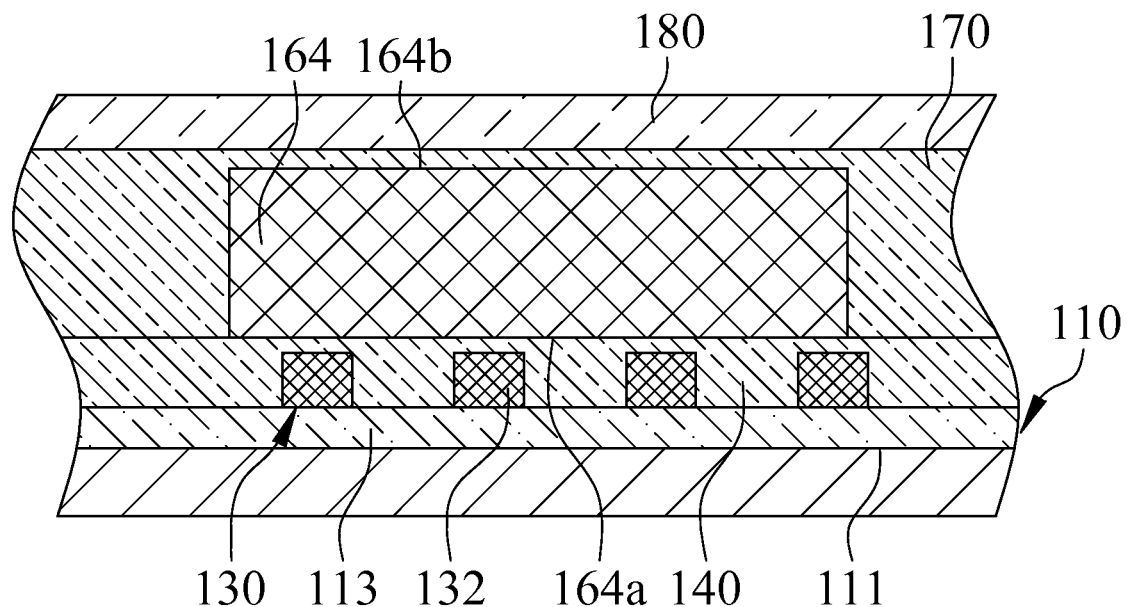
Figure 2M:
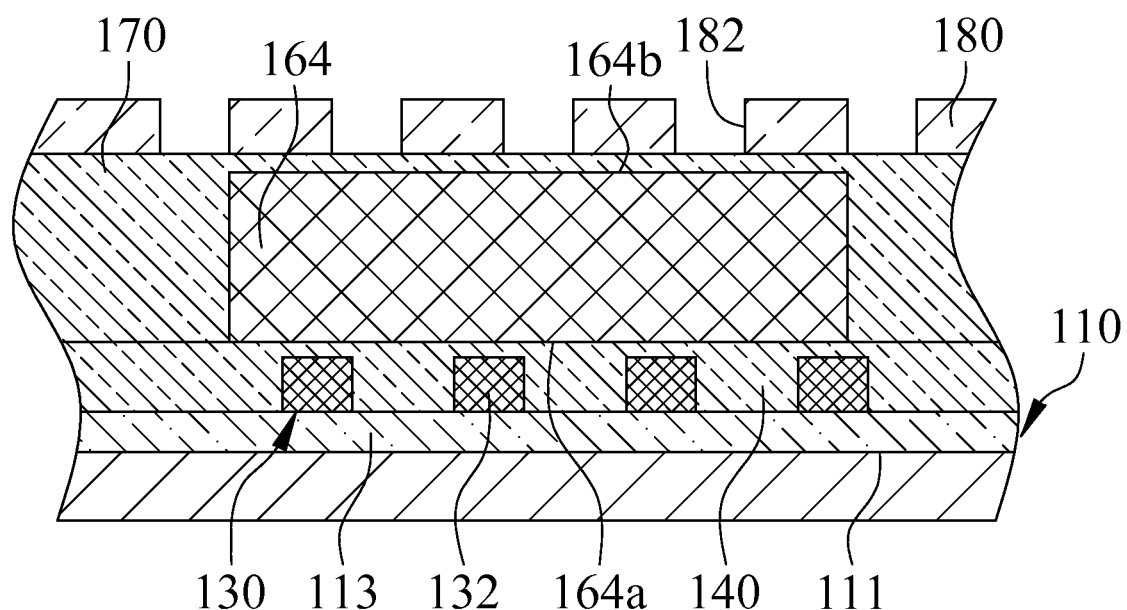
Figure 2N:
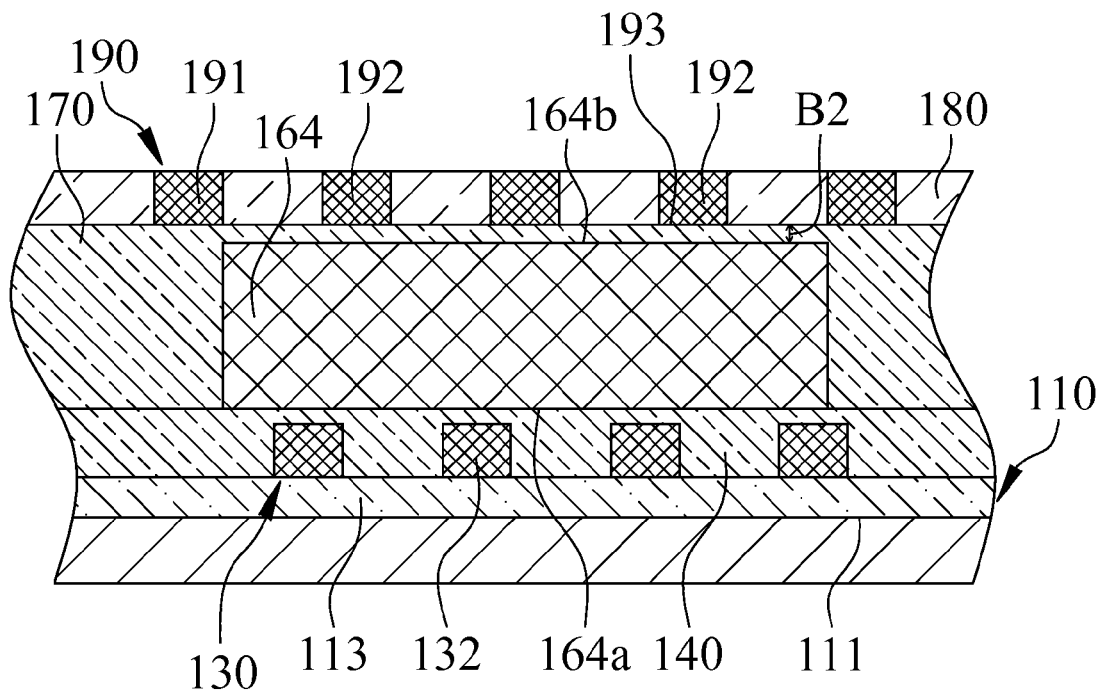
Figure 2O:
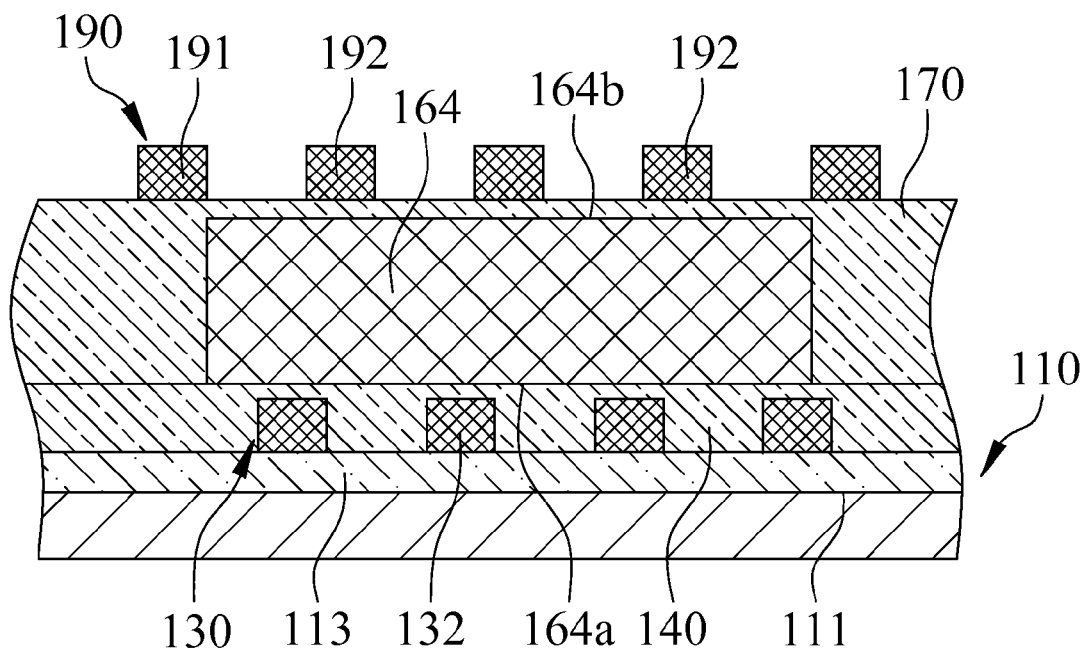
Figure 2P:
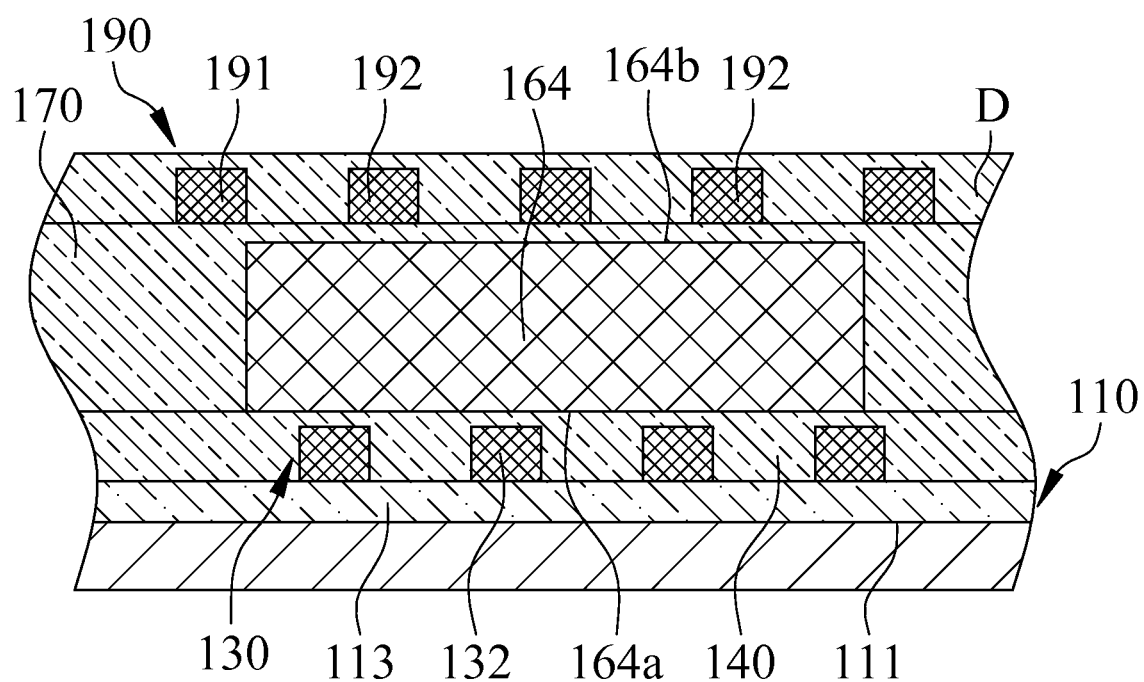

Please refers to FIGS. 1A to 1P and 2A to 2P, a method for fabricating a three dimensional inductor carrier with metal core in accordance with a first preferred embodiment of the present invention comprises the steps of: first, please referring to FIGS. 1A and 2A, providing a substrate 110 having a surface 111, at least one first bond pad 112, a protective layer 113 and a second bond pad 114, wherein the first bond pad 112 is disposed on the surface 111, the protective layer 113 is formed on the surface 111 and comprises at least one first pad opening 113a, a first disposing area 113b and a plurality of second disposing areas 113c, the first pad opening 113a reveals the first bond pad 112 and is located at the first disposing area 113b, the material of the substrate 110 can be chosen from one of Aluminum-Oxide substrate, Aluminum-Nitride substrate, Gallium-Arsenic substrate or glass substrate, and the protective layer 113 can be a passivation layer or re passivation layer; next, with reference to FIGS. 1B and 2B, forming a first photoresist layer 120 on the protective layer 113; thereafter, referring to FIGS. 1C and 2C, patterning the first photoresist layer 120 to form at least one first opening 121 and a plurality of first apertures 122, the first opening 121 reveals the first disposing area 113b, and the first apertures 122 reveal the second disposing areas 113c; afterwards, referring to FIGS. 1D and 2D, forming a first metal layer 130 within the first opening 121 and the first apertures 122 and enabling the first metal layer 130 to have a first conductive pad 131 and a plurality of first inductor portions 132, wherein each of the first inductor portions 132 comprises a first connection terminal 132a, a second connection terminal 132b and a first height H1; after that, with reference to FIGS. 1E and 2E, removing the first photoresist layer 120; next, referring to FIGS. 1F and 2F, forming a first dielectric layer 140 on the protective layer 113 and covering the first metal layer 130 with the first dielectric layer 140, wherein the first dielectric layer 140 comprises a second pad opening 141, a plurality of first connection openings 142 and a plurality of second connection openings 143, wherein the second pad opening 141 reveals the first conductive pad 131, each of the first connection openings 142 reveals each of the first connection terminals 132a, and each of the second connection openings 143 reveals each of the second connection terminals 132b; later, referring to FIGS. 1G and 2G, forming a second photoresist layer 150 on the first dielectric layer 140; afterwards, with reference to FIGS. 1H and 2H, patterning the second photoresist layer 150 to form a second aperture 151, a plurality of third apertures 152, a plurality of fourth apertures 153 and a slot 154, wherein the second aperture 151 reveals the first conductive pad 131, each of the third apertures 152 reveals each of the first connection terminals 132a, each of the fourth apertures 153 reveals each of the second connection terminals 132b, the slot 154 reveals the first dielectric layer 140 and is located between each of the third apertures 152 and each of the fourth apertures 153, wherein the second aperture 151 comprises a first top 151a, a first depth A1 is formed between the first top 151a and the first conductive pad 131, each of the third aperture 152 comprises a second top 152a, a second depth A2 is formed between each of the second tops 152a and each of the first connection terminals 132a, each of the fourth apertures 153 comprises a third top 153a, a third depth A3 is formed between each of the third tops 153a and each of the second connection terminals 132b, the slot 154 comprises a fourth top 154a, a fourth depth A4 is formed between the fourth top 154a and the first dielectric layer 140, and the fourth depth A4 is respectively smaller than the first depth A1, second depth A2 and the third depth A3; thereafter, referring to FIGS. 1I and 2I, forming a second metal layer 160 within the second aperture 151, the third apertures 152, the fourth apertures 153 and the slot 154 and enabling the second metal layer 160 to have a second inductor portion 161, a plurality of third inductor portions 162, a plurality of fourth inductor portions 163 and a metal core 164, wherein the second inductor portion 161 is coupled with the first conductive pad 131 and comprises a first top surface 161a and a second height H2, each of the third inductor portions 162 is coupled with each of the second connection terminals 132b and comprises a second top surface 162a and a third height H3, each of the fourth inductor portions 163 is coupled with each of the first connection terminals 132a and comprises a third top surface 163a and a fourth height H4, wherein the first height H1 is respectively smaller than the second height H2, third height H3 and fourth height H4, besides, the metal core 164 comprises a bottom surface 164a and a fourth top surface 164b, the first metal layer 130 comprises an upper surface 133, a first interval B1 is formed between the bottom surface 164a and the upper surface 133, in this embodiment, the fourth top surface 164b of the metal core 164 is respectively lower than the first top surface 161a of the second inductor portion 161, the second top surface 162a of each of the third inductor portions 162 and the third top surface 163a of each of the fourth inductor portions 163, besides, the material of the second inductor portion 161, the third inductor portion 162, the fourth inductor portion 163 and the metal core 164 can be chosen from one of nickel, iron or combination of nickel and iron; after that, with reference to FIGS. 1J and 2J, removing the second photoresist layer 150; next, referring to FIGS. 1K and 2K, forming a second dielectric layer 170 on the first dielectric layer 140 and covering the second metal layer 160 with the second dielectric layer 170, wherein the second dielectric layer 170 comprises a first exposed hole 171, a plurality of second exposed holes 172 and a plurality of third exposed holes 173, in this embodiment, the first exposed hole 171 reveals the first top surface 161a, each of the second exposed holes 172 reveals each of the second top surfaces 162a, and each of the third exposed holes 173 reveals each of the third top surfaces 163a; next, referring to FIGS. 1L and 2L, forming a third photoresist layer 180 on the second dielectric layer 170; afterwards, with reference to FIGS. 1M and 2M, patterning the third photoresist layer 180 to form a fifth aperture 181 and a plurality of sixth apertures 182, wherein the fifth aperture 181 reveals the first top surface 161a and the second top surface 162a, each of the sixth apertures 182 reveals each of the second top surfaces 162a and each of the third top surfaces 163a; referring to FIGS. 1N and 2N, forming a third metal layer 190 within the fifth aperture 181 and the sixth apertures 182 and enabling the third metal layer 190 to have a fifth inductor portion 191 and a plurality of sixth inductor portions 192, wherein the fifth inductor portion 191 is coupled with the second inductor portion 161 and the third inductor portion 162, each of the sixth inductor portions 192 is coupled with the third inductor portion 162 and the fourth inductor portion 163, in this embodiment, the material of the fifth inductor portion 191 and the sixth inductor portion 192 can be chosen from one of copper, silver or the combination of copper and silver, the fifth inductor portion 191 comprises a fifth height H5, each of the sixth inductor portions 192 comprises a sixth height H6, mentioned fifth height H5 is respectively smaller than the second height H2, third height H3 and the fourth height H4, and the sixth height H6 is respectively smaller than the second height H2, third height H3 and fourth height H4, in this embodiment, the third metal layer 190 comprises a lower surface 193, and a second interval B2 is formed between the fourth top surface 164b of the metal core 164 and the lower surface 193; later, with reference to FIGS. 1O and 2O, removing the third photoresist layer 180; finally, referring to FIGS. 1P and 2P, forming a third dielectric layer D within the second dielectric layer 170 and covering the third metal layer 190 with the third dielectric layer D thereby forming a three-dimensional inductor carrier with metal core 100. Besides, the three-dimensional inductor carrier with metal core 100 further comprises a second conductive pad P1 formed on the protective layer 113, the second conductive pad P1 is electrically connected with the second bond pad 114 of the substrate 110, the second metal layer 160 comprises a seventh inductor portion 165, the third metal layer 190 comprises an eighth inductor portion 194, the second conductive pad P1 is coupled with the seventh inductor portion 165, and the eighth inductor portion 194 is coupled with the seventh inductor portion 165 and the fourth inductor portion 163.

Figure 3:
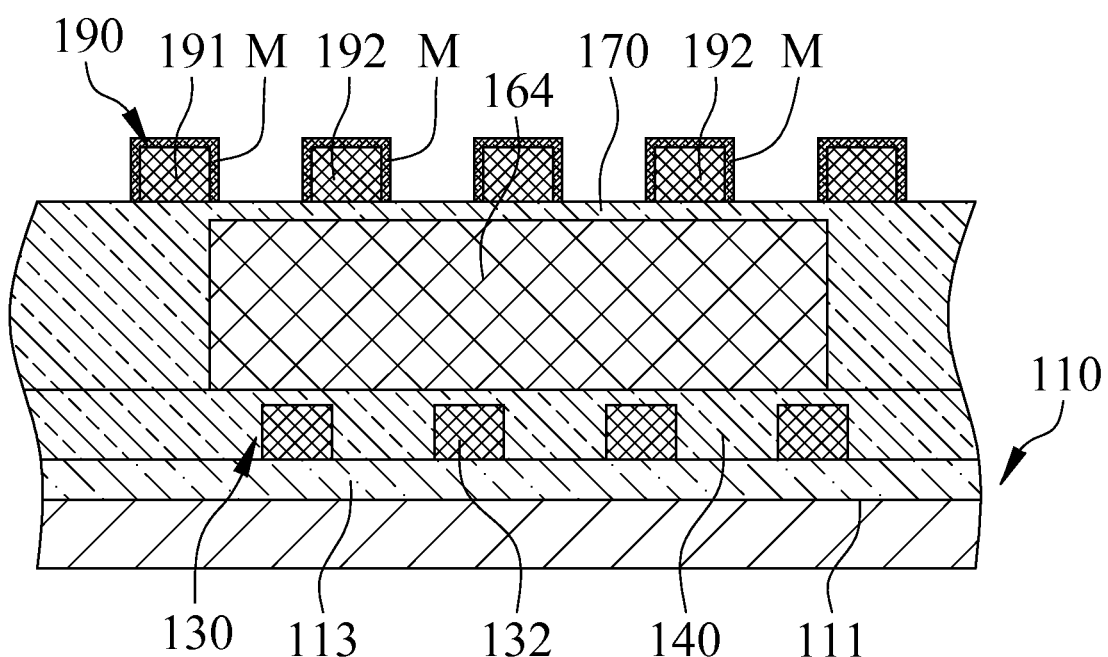
FIG. 3 is a cross-section diagram illustrating a method for fabricating a three-dimensional inductor carrier with metal core in accordance with a second preferred embodiment of the present invention.
Figure 4:
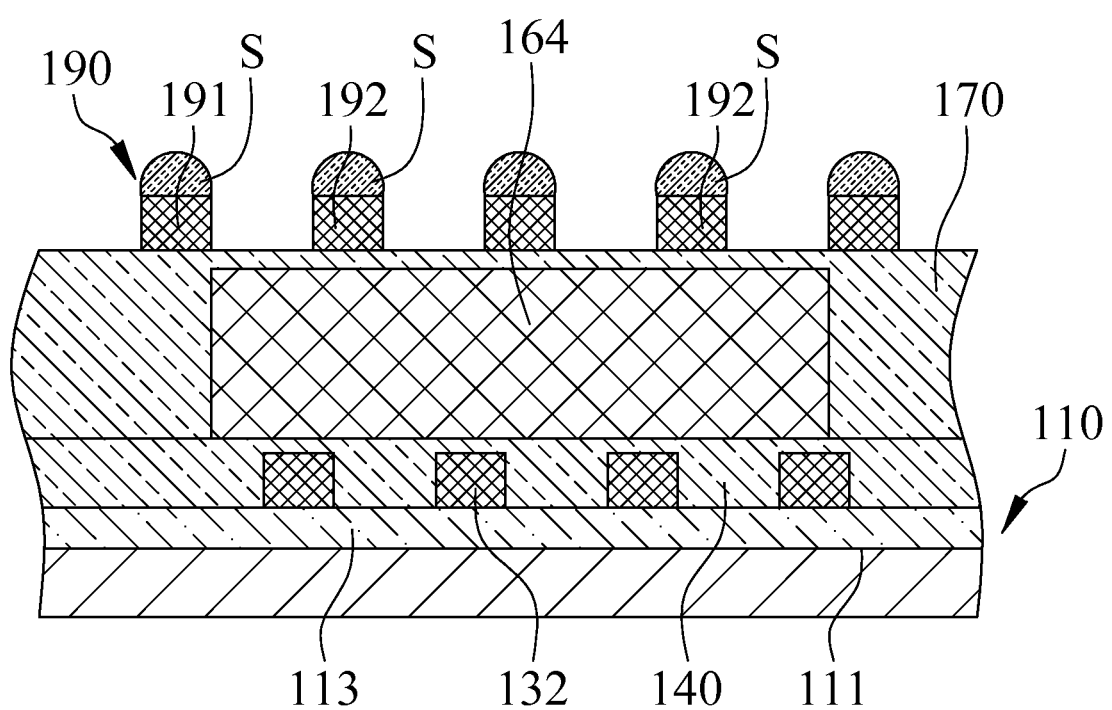
FIG. 4 is a cross-section diagram illustrating a method for fabricating a three-dimensional inductor carrier with metal core in accordance with a third preferred embodiment of the present invention.

Or, please refers to FIG. 3, which represents a second preferred embodiment of this invention. In this embodiment, the method for fabricating the three-dimensional inductor carrier with metal core further comprises the step of forming a nickel-gold protective layer M on the third metal layer 190 to replace the step of forming a third dielectric layer D on the second dielectric layer 170. Or, please refers to FIG. 4, which represents a third preferred embodiment of this invention. In this embodiment, a solder protection layer S is formed on the third metal layer 190, and the material of the solder protection layer S can be solder or unleaded solder.

Figure 5:
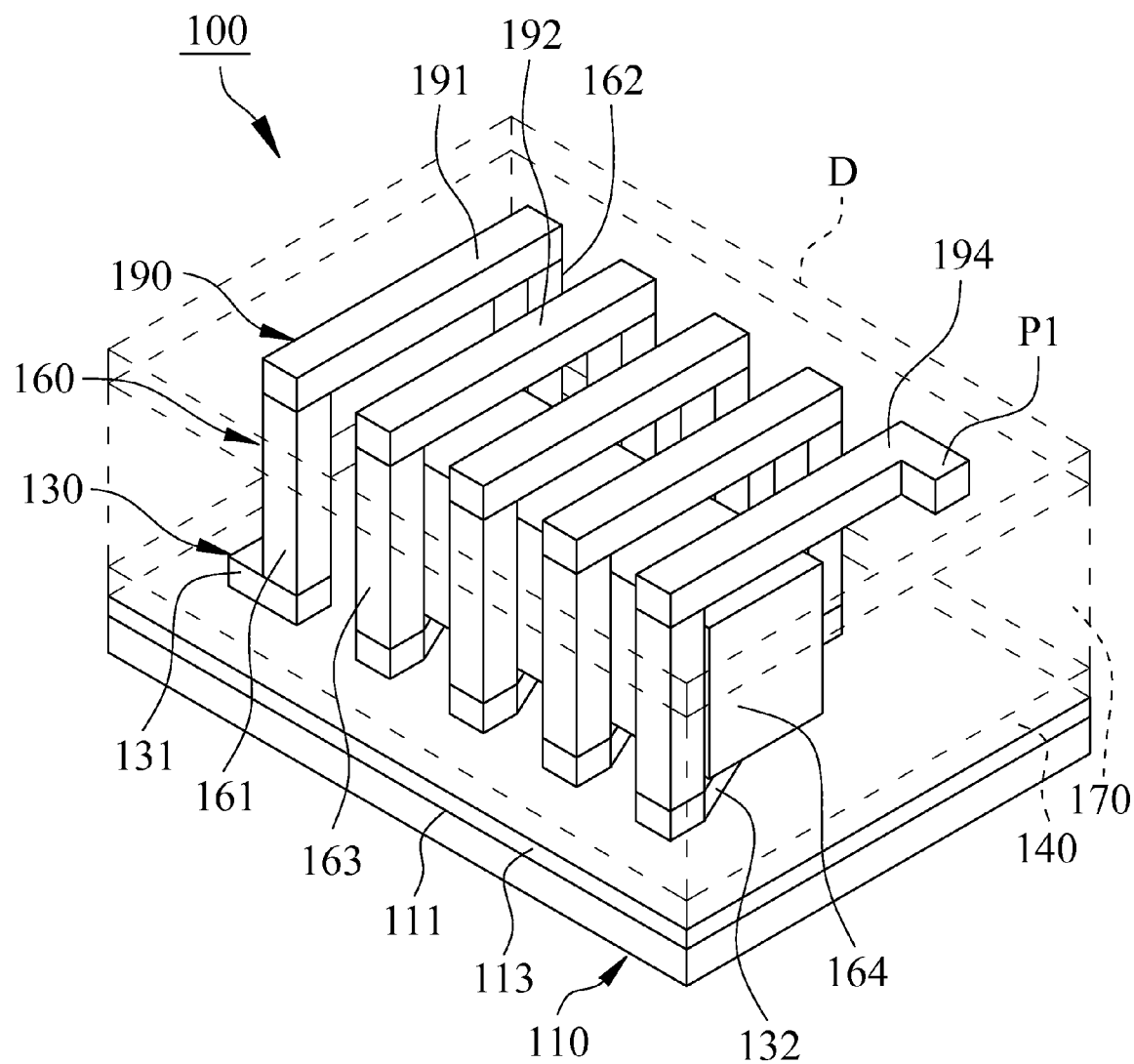
FIG. 5 is a three-dimensional diagram illustrating a method for fabricating a three-dimensional inductor carrier with metal core in accordance with a fourth preferred embodiment of the present invention.
Figure 6:
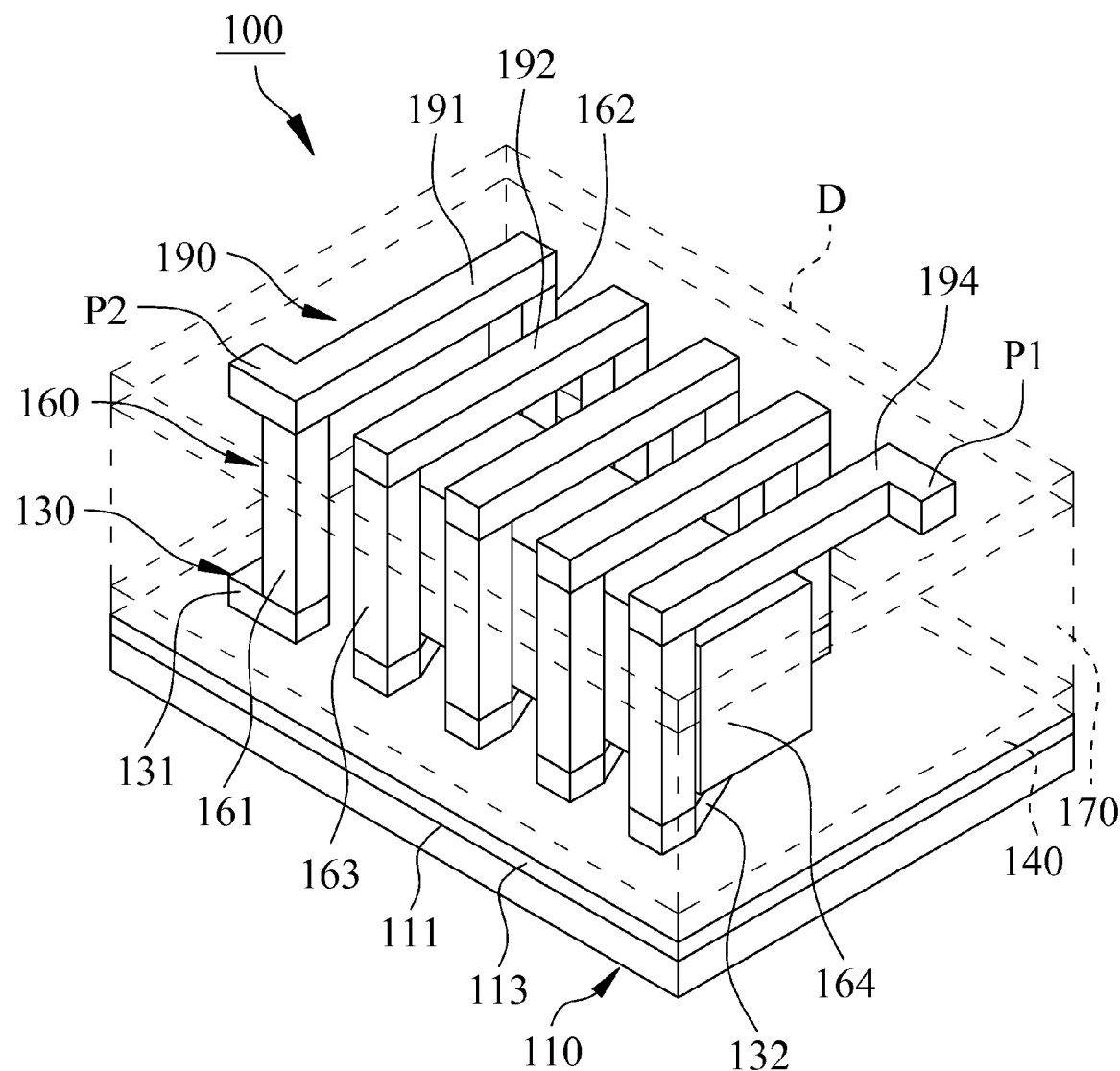
FIG. 6 is a three-dimensional diagram illustrating a method for fabricating a three-dimensional inductor carrier with metal core in accordance with a fifth preferred embodiment of the present invention.

Or, please refers to FIG. 5, which represents a fourth preferred embodiment of this invention. The second conductive pad P1 is formed on the second dielectric layer 170, and the eighth inductor portion 194 of the third metal layer 190 is coupled with the second conductive pad P1 and the fourth inductor portion 163. Further, referring to FIG. 6, which represents a fifth preferred embodiment of this invention. The three-dimensional inductor carrier with metal core 100 further comprises a third conductive pad P2, the second conductive pad P1 and the third conductive pad P2 are formed on the second dielectric layer 170, the second conductive pad P1 is coupled with the eighth inductor potion 194 of the third metal layer 190, and the third conductive pad P2 is electrically connected with the fifth inductor portion 191. In this invention, the inductor carrier possesses the structure of three-dimensional inductor and additional metal core thereby reducing the chip size and the layout area in a same plane. Besides, mentioned structure may increase coil density and magnetic flux. Furthermore, the magnetic flux direction of the inductor changes from normal to horizontal for three-dimensional designs of the inductor, and it is beneficial for electromagnetic coupling of flip chip module in the flip chip process.

A three-dimensional inductor carrier with metal core 100 in accordance with a first preferred embodiment of this invention is shown in FIGS. 1P and 2P. The three-dimensional inductor carrier with metal core 100 at least comprises a substrate 110, a first metal layer 130, a first dielectric layer 140, a second metal layer 160, a second dielectric layer 170, a metal core 164, a third metal layer 190, a second conductive pad P1 and a third dielectric layer D, wherein the substrate 110 comprises a surface 111, at least one first bond pad 112, a protective layer 113 and a second bond pad 114, the first bond pad 112 is disposed on the surface 111, the protective layer 113 is formed on the surface 111 and comprises at least one first pad opening 113a, and the first pad opening 113a reveals the first bond pad 112. In this embodiment, the material of the substrate 110 can be chosen from one of Aluminum Oxide substrate, Aluminum Nitride substrate, Gallium Arsenic substrate or glass substrate. The protective layer 113 can be a passivation layer or a repassivation layer. The first metal layer 130 is formed on the protective layer 113 and comprises a first conductive pad 131 and a plurality of first inductor portions 132, each of the first inductor portions 132 comprises a first connection terminal 132a, a second connection terminal 132b and a first height H1. The first dielectric layer 140 is formed on the protective layer 113 and covers the first metal layer 130, wherein the first dielectric layer 140 comprises a second pad opening 141, a plurality of first connection openings 142 and a plurality of second connection openings 143, the second pad opening 141 reveals the first conductive pad 131, each of the first connection openings 142 reveals each of the first connection terminals 132a, and each of the second connection openings 143 reveals each of the second connection terminals 132b. The second metal layer 160 is formed on the first dielectric layer 140 and comprises a second inductor portion 161, a plurality of third inductor portions 162, and a plurality of fourth inductor portions 163, wherein the second inductor portion 161 is coupled with the first conductive pad 131 and comprises a first top surface 161a and a second height H2, each of the third inductor portions 162 is coupled with each of the first connection terminals 132a and comprises a second top surface 162a and a third height H3, each of the fourth inductor portions 163 is coupled with each of the second connection terminals 132b and comprises a third top surface 163a and a fourth height H4, wherein the first height H1 is respectively smaller than the second height H2, third height H3 and fourth height H4. The material of the second inductor portion 161, the third inductor portion 162 and the fourth inductor portion 163 can be chosen from one of nickel, iron or combination of nickel and iron. The second dielectric layer 170 is formed on the first dielectric layer 140 and covers the second metal layer 160, the second dielectric layer 170 comprises a first exposed hole 171, a plurality of second exposed holes 172 and a plurality of third exposed holes 173, wherein the first exposed hole 171 reveals the first top surface 161a, each of the second exposed holes 172 reveals each of the second top surfaces 162a, and each of the third exposed holes 173 reveals each of the third top surfaces 163a. The metal core 164 is formed on the first dielectric layer 140 and located between each of the third inductor portions 162 and each of the fourth inductor portions 163, besides, the material of the metal core 164 can be chosen from one of nickel, iron or combination of nickel and iron. The metal core 164 comprises a bottom surface 164a and a fourth top surface 164b, the first metal layer 130 comprises an upper surface 133, a first interval B1 is formed between the bottom surface 164a and the upper surface 133, wherein the fourth top surface 164b of the metal core 164 is respectively lower than the first top surface 161a of the second inductor portion 161, the second top surface 162a of each of the third inductor portions 162 and the third top surface 163a of each of the fourth inductor portions 163. The third metal layer 190 is formed on the second dielectric layer 170 and comprises a fifth inductor portion 191, a plurality of sixth inductor portions 192 and a lower surface 193. In this embodiment, the material of the fifth inductor portion 191 and the sixth inductor portion 192 can be chosen from copper, silver or the combination of copper and silver, the fifth inductor portion 191 is coupled with the second inductor portion 161 and the third inductor portion 162, each of the sixth inductor portions 192 is coupled with the third inductor portion 162 and the fourth inductor portion 163. The fifth inductor portion 191 comprises a fifth height H5, each of the sixth inductor portions 192 comprises a sixth height H6, wherein the fifth height H5 is respectively smaller than the second height H2, third height H3 and fourth height H4, and the sixth height H6 is respectively smaller than the second height H2, third height H3 and fourth height H4. A second interval B2 is formed between the fourth top surface 164b of the metal core 164 and the lower surface 193 of the third metal layer 190. The second conductive pad P1 is formed on the protective layer 113 and electrically connected with the second bond pad 114 of the substrate 110. The second metal layer 160 further comprises a seventh inductor portion 165 electrically connected with the second conductive pad P1, and the third metal layer 190 further comprises an eighth inductor portion 194 electrically connected with the seventh inductor portion 165 and the fourth inductor portion 163. The third dielectric layer D is formed on the second dielectric layer 170 and covers the third metal layer 190.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A three-dimensional inductor carrier with metal core comprises:
    a substrate having a surface, at least one first bond pad and a protective layer, wherein the first bond pad is disposed on the surface, the protective layer is formed on the surface and comprises at least one first pad opening, and the first pad opening reveals the first bond pad;
    a first metal layer formed on the protective layer, the first metal layer comprises a first conductive pad and a plurality of first inductor portions, each of the first inductor portions comprises a first connection terminal, a second connection terminal and a first height;
    a first dielectric layer formed on the protective layer and covering the first metal layer, the first dielectric layer comprises a second pad opening, a plurality of first connection openings and a plurality of second connection openings, wherein the second pad opening reveals the first conductive pad, each of the first connection openings reveals each of the first connection terminals, and each of the second connection openings reveals each of the second connection terminals;
    a second metal layer formed on the first dielectric layer, the second metal layer comprises a second inductor portion, a plurality of third inductor portions and a plurality of fourth inductor portions, wherein the second inductor portion is coupled with the first conductive pad and comprises a first top surface and a second height, each of the third inductor portions is coupled with each of the first connection terminals and comprises a second top surface and a third height, each of the fourth inductor portions is coupled with each of the second connection terminals and comprises a third top surface and a fourth height, and the first height is respectively smaller than the second height, third height and fourth height;
    a second dielectric layer formed on the first dielectric layer and covering the second metal layer, the second dielectric layer comprises a first exposed hole, a plurality of second exposed holes and a plurality of third exposed holes, wherein the first exposed hole reveals the first top surface, each of the second exposed holes reveals each of the second top surfaces, and each of the third exposed holes reveals each of the third top surfaces;
    a metal core formed on the first dielectric layer, the metal core is located between each of the third inductor portions and each of the fourth inductor portions, the metal core comprises a bottom surface, the first metal layer comprises an upper surface, a first interval is formed between the bottom surface and the upper surface; and
    a third metal layer formed on the second dielectric layer, the third metal layer comprises a fifth inductor portion and a plurality of sixth inductor portions, the fifth inductor portion comprises a fifth height and is coupled with the second inductor portion and the third inductor portion, each of the sixth inductor portions comprises a sixth height and is coupled with the third inductor portion and the fourth inductor portion, the fifth height is respectively smaller than the second height, third height and fourth height, and the sixth height is respectively smaller than the second height, third height and fourth height.

2. The three-dimensional inductor carrier with metal core in accordance with claim 1, wherein the third metal layer comprises a lower surface, the metal core comprises a fourth top surface, a second interval is formed between the fourth top surface and the lower surface.

3. The three-dimensional inductor carrier with metal core in accordance with claim 1, wherein the metal core comprises a fourth top surface, the fourth top surface of the metal core is respectively lower than the first top surface of the second inductor portion, the second top surface of each of the third inductor portions and the third top surface of each of the fourth inductor portions.

4. The three-dimensional inductor carrier with metal core in accordance with claim 1, wherein the material of the fifth inductor portion and the sixth inductor portion can be chosen from one of copper, silver or the combination of copper and silver.

5. The three-dimensional inductor carrier with metal core in accordance with claim 1, wherein the material of the second inductor portion, the third inductor portion, the fourth inductor portion and the metal core can be chosen from one of nickel, iron or the combination of nickel and iron.

6. The three-dimensional inductor carrier with metal core in accordance with claim 1, further comprises a second conductive pad formed on the protective layer, and the substrate further comprises a second bond pad electrically connected with the second conductive pad.

7. The three-dimensional inductor carrier with metal core in accordance with claim 1, wherein the second metal layer comprises a seventh inductor portion coupled with the second conductive pad.

8. The three-dimensional inductor carrier with metal core in accordance with claim 7, wherein the third metal layer comprises an eighth inductor portion coupled with the seventh inductor portion and the fourth inductor portion.

9. The three-dimensional inductor carrier with metal core in accordance with claim 1, further comprises a second conductive pad formed on the second dielectric layer, and the third metal layer comprises an eighth inductor portion electrically connected with the second conductive pad and the fourth inductor portion.

10. The three-dimensional inductor carrier with metal core in accordance with claim 1, further comprises a third dielectric layer formed on the second dielectric layer, and the third metal layer is covered by the third dielectric layer.

11. The three-dimensional inductor carrier with metal core in accordance with claim 1, further comprises a nickel-gold protective layer formed on the third metal layer.

12. The three-dimensional inductor carrier with metal core in accordance with claim 1, further comprises a third conductive pad formed on the second dielectric layer, and the fifth inductor portion is electrically connected with the third conductive pad.

* * * * *